US007233599B2

(12) United States Patent
Deas et al.

(10) Patent No.: US 7,233,599 B2
(45) Date of Patent: Jun. 19, 2007

(54) INTERFACE DEVICE WITH STORED DATA ON TRANSMISSION LINES CHARACTERISTICS

(75) Inventors: Alexander Roger Deas, Edinburgh (GB); Igor Anatolievich Abrosimov, St.Petersburg (RU)

(73) Assignee: Patentica IP Ltd, Manchester (GB)

( * ) Notice: Subject to any disclaimer, the term of this patent is extended or adjusted under 35 U.S.C. 154(b) by 874 days.

(21) Appl. No.: 10/090,829

(22) Filed: Mar. 6, 2002

(65) Prior Publication Data
US 2002/0131438 A1 Sep. 19, 2002

(51) Int. Cl.
*H04L 12/28* (2006.01)
*H04L 12/56* (2006.01)

(52) U.S. Cl. ............... 370/420; 370/412; 370/415; 370/417; 370/418; 370/422; 370/421; 714/436; 714/700

(58) Field of Classification Search ............ 370/419, 370/420; 324/158.1, 765, 537; 714/736, 714/700
See application file for complete search history.

(56) References Cited

U.S. PATENT DOCUMENTS

| RE31,056 E | * | 10/1982 | Chau et al. ............... 714/700 |
| 4,497,056 A | * | 1/1985 | Sugamori ................... 714/736 |
| 5,225,775 A | * | 7/1993 | Sekino ..................... 324/158.1 |
| 6,073,259 A | | 6/2000 | Muething, Jr. et al. ..... 714/724 |
| 6,281,698 B1 | * | 8/2001 | Sugimoto et al. ........... 324/765 |
| 6,469,493 B1 | * | 10/2002 | Muething et al. ........ 324/158.1 |
| 6,693,436 B1 | * | 2/2004 | Nelson ....................... 324/537 |
| 6,750,672 B2 | * | 6/2004 | Tanimura et al. ........... 324/765 |
| 6,784,684 B2 | * | 8/2004 | Tanimura ..................... 324/765 |

FOREIGN PATENT DOCUMENTS

| DE | 19922907 A | 12/1999 |
| GB | 2322203 A | 8/1998 |
| WO | WO 00 00837 A | 1/2000 |

* cited by examiner

Primary Examiner—Wellington Chin
Assistant Examiner—Raj Jain

(57) ABSTRACT

The present invention relates to high speed communications, in particular, to an interface device between a transmitting device and a receiving device of a transmission system, wherein the transmitting device is capable of automatic compensation of cross-talk timing errors in the interface device, for a group of signals, by using information stored in a storage attached to that interface device. Preferably, the data stored in said storage comprises data on interconnections between said first and second plurality of terminals and data on crosstalk timing errors in said transmission lines relating to a specific data pattern, for each of said stored interconnection.

24 Claims, 5 Drawing Sheets

INTERFACE DEVICE WITH STORED DATA ON TRANSMISSION LINES CHARACTERISTICS

BACKGROUND OF THE INVENTION

1. Technical Field

The present invention relates to high speed communications, in particular, to an interface device between a transmitting device and a receiving device of a transmission system, wherein the transmitting device is capable of automatic compensation of cross-talk effects in the interface device by using information stored in an integrated circuit attached to that interface device. .

The present invention is particularly applicable to interfaces to logic and memory devices, to test equipment for testing semiconductor devices and to high speed communications.

2. Background of the Invention

It shall be appreciated that the invention can be applied to a wide variety of fields, though examples and background information, without limitation to the scope of the invention, represent automated semiconductor testing. Test equipment is typically used to determine whether a device under test ("DUT") follows a set of timing specifications. Accordingly, timing accuracy plays a vital role in the design of test equipment because a discrepancy in the timing accuracy can result in an incorrect classification of a DUT.

A typical test equipment comprises a tester and a device interface board (DIB) connected thereto. A test socket adapted to receive a DUT is mounted on the interface board. A plurality of transmission lines such as coaxial cables or strip lines are provided which join contacts of the test socket and junctions of the interface board with the testing device. The tester and the interface board are interconnected by urging pin electrodes provided on one of them against planar electrodes provided on the other, by pressing planar electrodes provided on both of them against each other, or by engaging connectors provided on both of them with each other. A device to be tested is mounted on the test socket.

A signal generator in the tester generates a test signal of logical levels at specified timings, based on a pattern and a timing signal. The test signal is converted by a driver in the tester into a signal voltage of a predetermined level such as the ECL or TTL level, which is supplied from the tester to pins of the DUT via the transmission lines of the interface board. Then, the resulting DUT output response signals are provided via the transmission lines to the tester, wherein they are compared by a comparator with a reference voltage for the decision of their logical level. Each logical signal based on the decision is compared by a logical comparator with an expected value pattern contained in the data pattern, and the output from the logical comparator is used to determine whether the DUT is good or bad.

In this instance, it is necessary that the timing for sending out the test signal and the timing for fetching the DUT output response signal in the tester be determined taking into account not only the relative delay times between respective circuits in the tester corresponding to the pins of the DUT or delays in the transmission lines but also crosstalk or crosstalk artifacts times of the transmission lines of the interface board which are connected to the pins of the DUT.

The following methods have been proposed to adjust the test signal send-out timing and the DUT output response signal acquisition timing.

According to one of these methods, the transmission lines are made equal in length to make the above-mentioned delay times in the interface board constant, and in the tester, the above-said timing is corrected using data on the constant time. This method suffers from differences between the physical length—all wires are normally the same actual length, and the electrical length for a given pattern. According to another method, the actual lengths of the transmission lines and the delay times are measured, the measured data are stored in a memory provided in the tester and the above-said timing is adjusted using the data read out of the memory. This method tries to adjust delay times by measuring the electrical length of isolated traces. In practice, the electrical length is influenced heavily by crosstalk, so the electrical length during measurement is not an accurate representation of the electrical length in service.

According to still another method, such as described in U.S. Pat. No. 5,225,775, the DUT connection board is equipped with a nonvolatile storage for storing data on the delay times in the transmission line on the connection board corresponding to each terminal of the device under test, and the tester main body unit is so constructed as to adjust the test signal send-out timing and the device output response signal acquisition timing based on the data read out of the storage. Storing the actual topography and topography dependent parameters in a serial presence detect (SPD) memory and adjusting a control signal accordingly is known also from U.S. Pat. No. 6,321,282. This suffers the same problems as previously mentioned, i.e. the electrical length during isolated test differs from that in service due to the neglect of the crosstalk coefficients.

According to U.S. Pat. No. 5,225,775, a calibration procedure is performed by selecting one of a plurality of transmission lines on the connection board and measuring a time required for a signal to pass via this connection board, while all the other transmission lines are silent. Thus, cross-talk from adjacent lines is not taken into account.

As the speeds at which electronic devices operate have increased dramatically and it is not uncommon for these memory devices to run at frequencies at or greater than 100 MHz, the above mentioned methods fails to provide an adequate accuracy of timings. To test at such high frequencies, tester systems include a clock running at or above the maximum frequency at which devices can be tested. As clock frequencies increase, factors such as transmission line crosstalk or crosstalk artifacts such as uneven transmission line performance become significant. To compensate for such variations, some tester systems, such as production-oriented automatic test equipment (ATE) testers, use very high frequency (some as high as 1 GHz) to provide very fine resolutions. However, in these systems crosstalk in signal paths can influence greatly the accuracy of calibration.

Still one more problem arises when the number of testing signals required to test a semiconductor device increases and it becomes more and more complicated technically to compensate timing errors for individual signals in each separate transmission line.

The similar problems arise in high speed communications where it is required to reduce artifacts introduced into a communication channel from the limited and non-linear characteristics of the channel, such as by reflections not being absorbed efficiently or cross-talk between the transmission lines.

BRIEF SUMMARY OF THE INVENTION

Generally, the present invention is directed to an interface device, such as between a transmitter and a receiver in a communication channel, or such as an interface board for a tester system, provided with a means to compensate for uneven transmission line performance, e.g. caused by crosstalk or crosstalk artifacts using stored data on transmission characteristics.

According to one aspect of the invention, an interface device is provided for connecting a transmitting device having a first plurality of terminals and deriving a plurality of signals of a predetermined data pattern, the signals being arranged in groups, and a receiving device having a second plurality of terminals for receiving said signals;

the interface device having, respectively, input connectors connectable to said transmitter's terminals and output connectors connectable to said receiver's terminals, the inputs and outputs being interconnected by transmission lines within said interface device, the transmission lines being arranged in groups corresponding to said groups of signals; and a storage for storing data on interconnections between said first plurality and second plurality of terminals and data on timing errors caused by crosstalk in each said group of transmission lines, measured with respect to a reference signal and relating to a specific data pattern, for each of said stored interconnection;

wherein the transmitting device is capable of compensating for timing errors in said groups of transmission lines using data read from said memory storage.

In another aspect, a test system is provided incorporating the interface device according to the invention.

In still another aspect, a method of compensation of timing errors in transmission lines is provided comprising the steps of:

transmitting via transmission lines a plurality of signals of a predetermined data pattern to be applied to a semiconductor device, the signals being driven in groups;

comparing the output response of a group of signals with a reference signal level;

storing in a non-volatile memory data on timing errors in said transmission lines relating to specific data patterns, for each separate group of signals; and compensating for timing errors in said transmission lines for each said group of signals using said data read from said nonvolatile memory.

In still another aspect, a method of testing semiconductor devices employing the above method of compensation is provided.

In FIG. 5, a typical interface device 52 according to the invention is shown having a plurality of transmission lines within the device (not shown), input connectors 57 for connecting to a tester head, a DUT socket 55 with output connectors 51 for connecting to a DUT and a storage 54 for storing data on interconnections and correction coefficients for compensating for timing errors caused by crosstalk in transmission lines.

According to the present invention, a tester interface such as a DUT interface board (DIB) is equipped with a means for storing the results of measurements of transmission line behavior caused by the combination of crosstalk or crosstalk artifacts and physical manufacturing tolerances or impedance errors in signal paths in a test head and interface board. The timing errors are measured for a group of signals and compensated by applying correction coefficients to a whole group of signals which provides increasing greatly the effectiveness of compensation and reduces time consuming calibration operations. In testers, the information is used to enable accurate calibration of timings of signals associated with a DUT.

In the testing equipment of the above construction according to the present invention, the length of the transmission lines on the interface board corresponding to the respective groups of terminals of the DUT are all known precisely from PCB design software. This software enables the DIB card to be designed so as to completely eliminate inaccuracy caused by errors in trace lengths. What remains are manufacturing errors and crosstalk. While manufacturing errors may be measured at the production stage and the resulting correction coefficients may be stored in a memory storage mounted on a DIB, the effect of crosstalk is still the key source of inaccuracy left which depends on particular data pattern. Measurements of crosstalk and compensation thereof automatically equilibrates variations in manufacturing impedance due to fluctuations in PCB manufacturing process such as fluctuations in thickness, dielectric constants and other technology and material parameters which may be revealed to different extent during usage.

According to the present invention, the data on crosstalk and crosstalk artifacts is stored together with the information about interconnections required for a certain type of the DUT. The data on interconnections is stored in a storage device attached to the DIB and is retrieved automatically when the test is started. As the crosstalk and crosstalk artifacts depend on particular interconnection scheme, the measurements are conducted not only for each test pattern, but for each card interconnection. This is useful as the variety of DUT form factors requires many different DIB cards to be used in connection with each different DUT type. Though the interconnections for different DUT types are different, to unify the DIB card treatment by software, it is very convenient to store the information about DIB card interconnections comprising crosstalk information, in DIB card itself. A more detailed description of the DIB card of the present invention is presented in Attachment A.

DETAILED DESCRIPTION OF THE INVENTION

The present invention will be further described in detail with reference to the accompanying drawings illustrating an example embodiment of the device interface board for an IC tester. However, it shall be appreciated that the present invention is not limited to ATE and may be equally employed by a specialist in the art to communication equipment.

Figure 1:
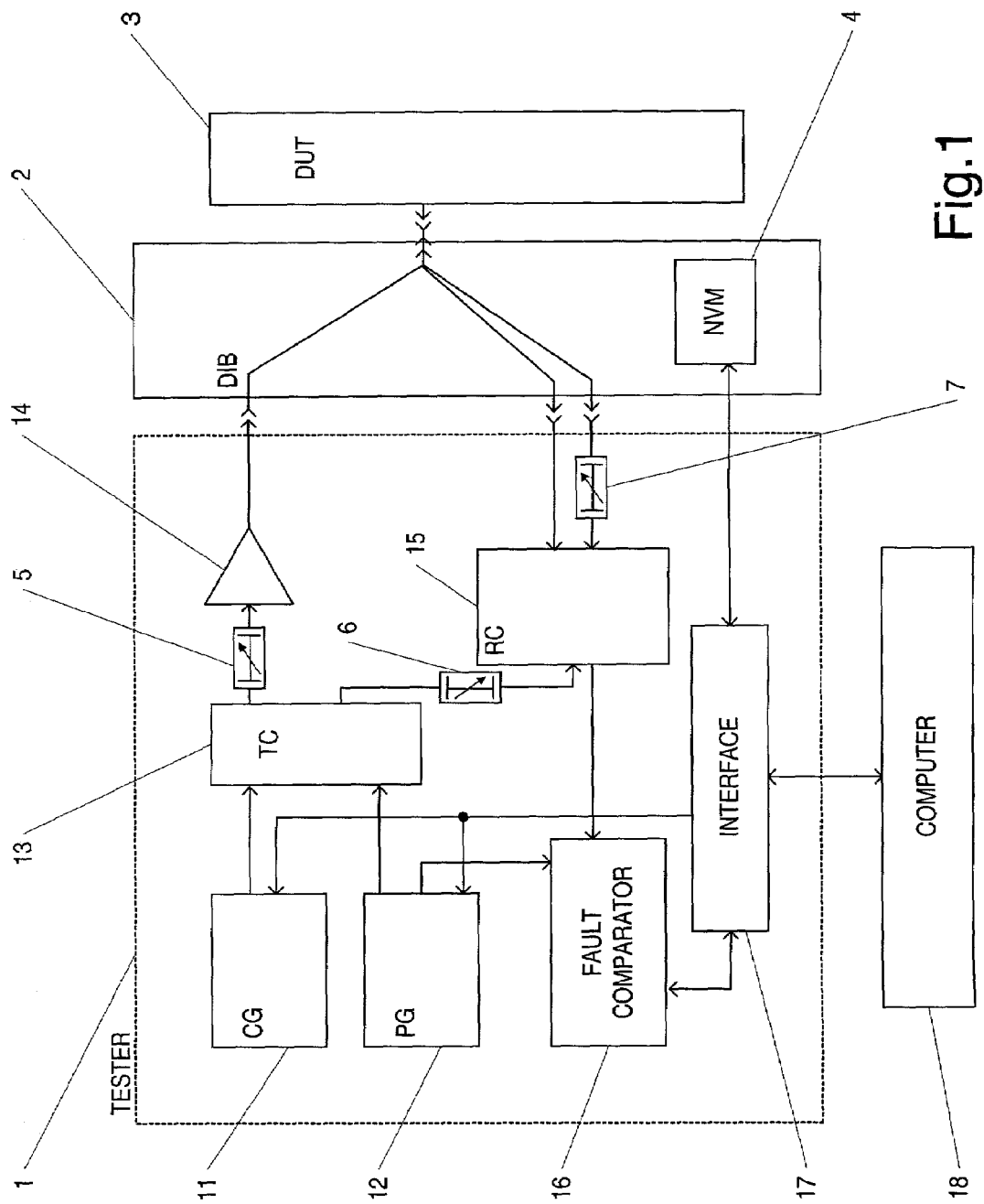
FIG. 1 is a schematic block diagram of a testing device according to the invention.

As shown in FIG. 1, the DUT testing device is provided with a tester 1 and a device interface board (DIB) 2. The tester includes a clock generator 11, a pattern generator 12, timing control circuits 13, drivers 14, receivers 15 and fault comparator 16 for storing the data for cycles containing differences between data provided by pattern generator 12 and DUT 3. Delays 4, 5, 6 are used to provide compensation for timing errors in transmission lines within interface device 2. The tester is controlled by a computer 18 through interface 17. The controlling computer may be external as well as an internal computer may be provided.

The clock generator 11 generates, based on an internal operation clock CLK, a clock signal to be applied to the drivers 14, receivers 15 and DUT 3 through timing control circuits 13. Timing control 13 comprises a means to control the crosstalk or crosstalk artifacts in output signals from drivers 14 and crosstalk or crosstalk artifacts in receivers' 15 clock signals. The pattern generator 12 operates in synchronization with the system clock CLK from the clock generator 11 to generate patterns to be provided via timing control 13 to the terminal pins of the DUT 3.

The DIB 2 comprises a storage 4, such as non-volatile memory, e.g. flash memory, for storing data on timing errors caused by crosstalk or crosstalk artifacts in transmission lines in the board 2 corresponding to each terminal of the DUT to make corrections to the results of tests based on the data read out from the storage 4. The storage memory shall be of a type allowing to read/write data after each calibration procedure and store them when the device is switched off.

The fault comparator 16 compares the obtained signal from the DUT with the expected value from the pattern generator 12 to produce test results which are downloaded by the computer 18 through interface 17 for further processing by a computer software. The said software uses the crosstalk or crosstalk artifacts data stored in the storage 4 for compensating timing errors in final results for a current data pattern. The same data may be used to manage the timing control circuitry 13 to compensate effects of crosstalk for each particular pattern by adding these data to values which shall define crosstalk or crosstalk artifacts in drivers 14.

The above test system may be essentially the same as disclosed, for example, in U.S. application Ser. No. 60/209,613 "Test systems for protocol memories" filed on 6 Jun. 2000, or PCT/RU01/00234 filed on Jun. 06, 2001, the specification of which applications is incorporated herein by reference.

Figure 2:
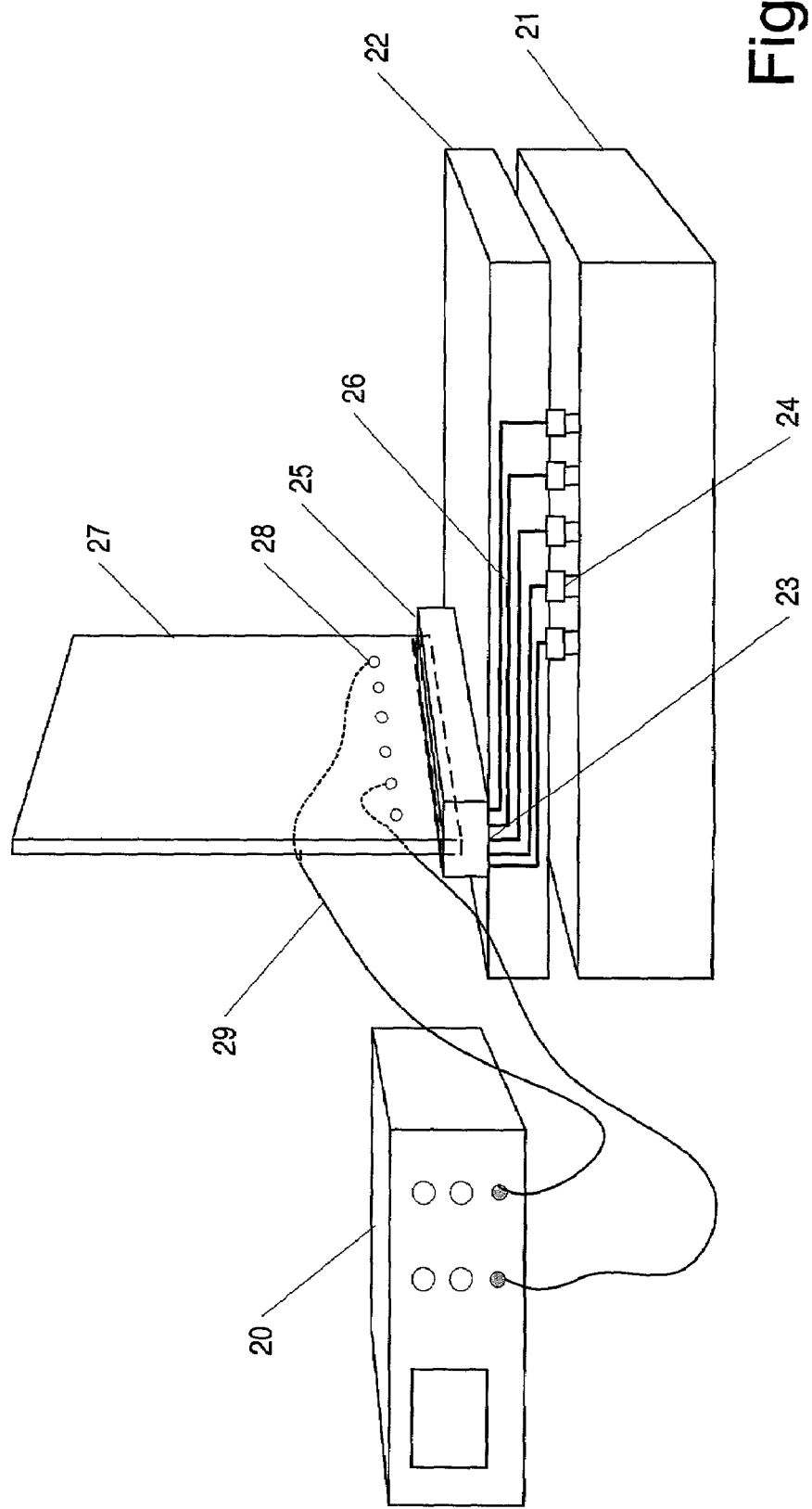
FIG. 2 is a block diagram illustrating example equipment for measurement of crosstalk in transmission lines of a DIB according to the present invention.

As shown in FIG. 2, on the interface device 22 which is in this example a device interface board (DIB) there is mounted the DUT socket 25 and the transmission lines 26 are provided within the DIB 22 which connect contacts of the socket 25 to the junctions between the DIB 22 and the tester 21.

Figure 4A:
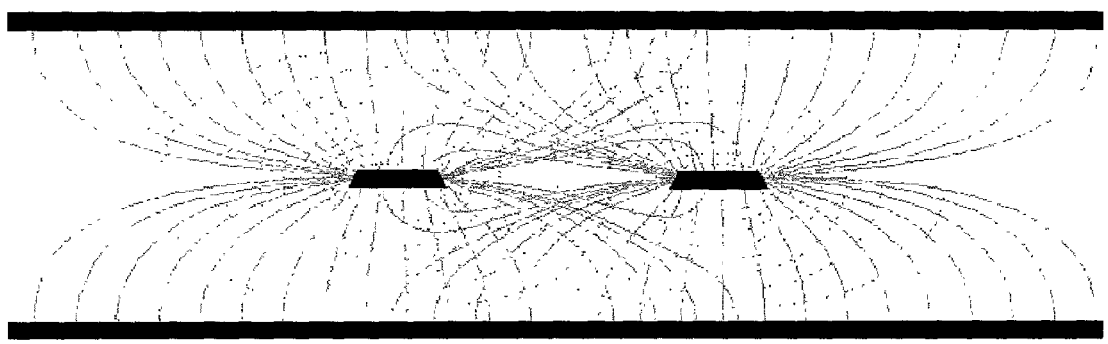
FIG. 4a is a diagram explaining the influence of crosstalk in the transmission lines of the interface board.

The lengths of the transmission lines 26 are the same. Though the transmission lines are separated as a rule by insulation material, they have mutual capacitance and inductance caused by magnetic and electric fields having areas of intersections of force lines as illustrated in FIG. 4. This cross-talk influence is exacerbated in synchronous systems wherein all the signals are synchronized, i.e. they change state at one and the same time. These effects cause a part of the signal to penetrate from one transmission line into another. As a result, a moment when the signal crosses the threshold at the output of transmission line depends on signals in other transmission lines, i.e. it depends on a particular data pattern. Thus, one of the important features of the present invention is that the timing errors caused by crosstalk effects are measured when the tester is running a test pattern to provide compensation of the timing error caused by this particular combination of signals. The knowledge of the influence of the signal crosstalk for each data pattern provides a basis for crosstalk compensation for each data pattern. Another important feature is that the timing errors are measured for a group of signals and the compensation coefficients are applied to these groups also to adjust the position of this group in whole with respect to a reference signal.

To the contrary, according to a method as described in U.S. Pat. No. 5,225,775, the measurements of the delay times and storing of the measured data into the storage are performed on the stage when the interface device has been fabricated, i.e. with no regard to a particular test pattern, also, the possibility of correcting these data during the exploitation of the interface device in a particular application is neither proposed, nor surmised.

Moreover, according to the known method, the delay times are stored for each transmission line and correction is applied to each signal. However, in practice, in high speed transmission of signals, it has been discovered that the skew between signals within one group is relatively low comparing to the skew between different groups of signals. Thus, it is assumed in the present invention that the timing skew of individual signals within one group is less than the skew of the group of signals in whole. For example, the group skew equal to ±250 ps means that the individual signal skew is lower than ±250 ps.

FIG. 2 illustrates a method according to which the aforementioned timing errors caused by crosstalk in the transmission lines of the interface device are measured and the measured data is stored in the storage on the interface device.

The interface device 22 comprises socket 25, which can be for example, a DIMM socket. During the calibration, no DUT is mounted on the interface device. Instead, preferably, a crosstalk card 27 is installed in DUT socket 25. Generally, the crosstalk card is a PCB having no electronic components mounted thereon and comprising contact points 28 which correspond to contact points of a real DUT (e.g. a DIMM) and which are made connectable to oscilloscope probes 29. To provide maximum accuracy of measurements, the crosstalk card preferably has transmission lines of minimum electrical length and the test points arranged closely to the ground point.

However, in a general case, the use of this card is not necessary, while the probes may be connected directly to interface device 22 close to the DUT socket, or another suitable device may be used for this purpose.

A tester, such as a conventional tester for testing synchronous memory, e.g. BT72 manufactured by Acuid Corporation Limited (Guernsey), comprising a tester head 21 and a tester main body (not shown in FIG. 2), is powered on, and the selected data pattern is running. The tester shall be fully in operation and the tester head's flash memory (SPD, serial presence detect) and an interface device 22 shall be initialized with start-up values. At this stage the SPD Reader/Writer software tool is used to initialize the tester head's SPD. The next step is initialization of an SPD installed on the interface device 22.

The SPD installed on the interface device, or DIB (device interface board), is generally designed so that it comprises at least three arrays of data that is read by the tester and provided to the controlling computer. In the first array, the number and type of the connector of the DIB is stored. In the second array, a table is stored relating to interconnection of contacts of the DUT and test signals. In the third array, correction coefficients are stored that are written to this memory during production and bears information on timing errors in transmission lines, measured during calibration. These correction coefficients are further adjusted according to the invention for crosstalk timing errors.

To obtain the required accuracy of measurements, an oscilloscope 20 is used, which may be a calibrated 1 GHz bandwidth, 4 GS/s sample, or better version digital oscilloscope having at least two active probes having input capacitance not more than 1 pF, for example, TDS794 manufactured by Tektronix Inc. (OR). One probe of the oscilloscope is connected to the crosstalk card 27 at a point $CK_0$ providing a signal used for triggering the scope, preferably, a clock signal. The second probe of the oscilloscope is connected sequentially to each of the other signal lines.

The signals are grouped in accordance with its functionality, so that, for example, data signals are arranged in separate groups, clock signals are arranged in other separate group, DQ (bi-directional data) signals are arranged in another groups. An example of typical signal grouping is shown in Appendix B.

The crosstalk timing error of a selected group of signals is measured with respect to the reference clock signal CK0. Another clock signal CK1 is used to trigger the scope. Note that, for timing error measurement, all signals are observed on test points of crosstalk card 27. Both rising and falling edges of a signal being measured are to be considered. To observe them simultaneously, the scope shall be configured so as to accumulate waveforms with reasonable persistence and triggered from a clock signal.

Timing error measurements are performed whilst the system is running a special crosstalk test. This test is running continuously to generate transitions on all signals to be checked. To achieve the best possible precision and resolution, the scope should have only one channel activated when taking measurements. This will ensure that the total sample rate is not divided between several channels but fully assigned to the channel which is used for measurements. The other channel is only used to trigger the scope. For a DDR memory, differential signals are used for measurements.

Before skew measurements, a clock signal delay is measured to provide high accuracy in subsequent calculations.

For initial tuning, a trigger channel connected to CK1 is enabled and trigger level is adjusted, for example, to 1.4 for SDR memory, or 1.25V for a DDR type memory. When the expected rising edge of the clock is observed, the other channel is connected to CK0. This channel is selected as a reference signal for crosstalk measurements. A rising edge of the signal CK0 is selected close to the edge of CK1, and then, the first channel (CK1) is disabled.

Figure 4B:
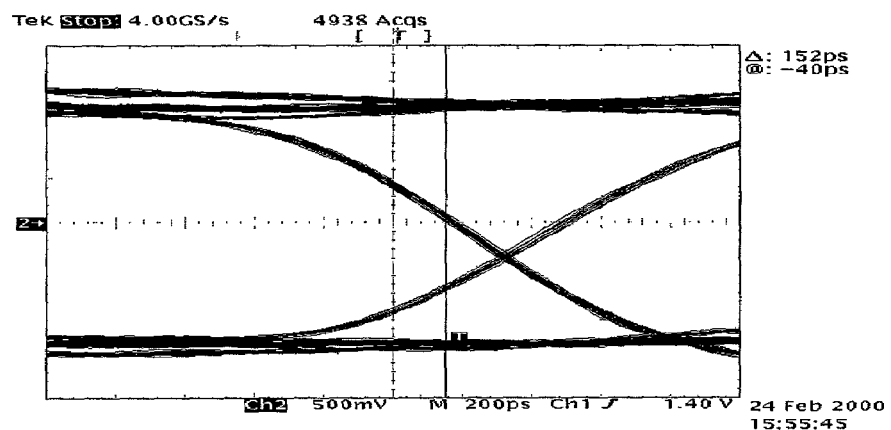
FIG. 4b is a graph illustrating a calibration procedure in relation to reference signal, wherein the calibration is performed at a rising edge of a clock signal.
Figure 4C:
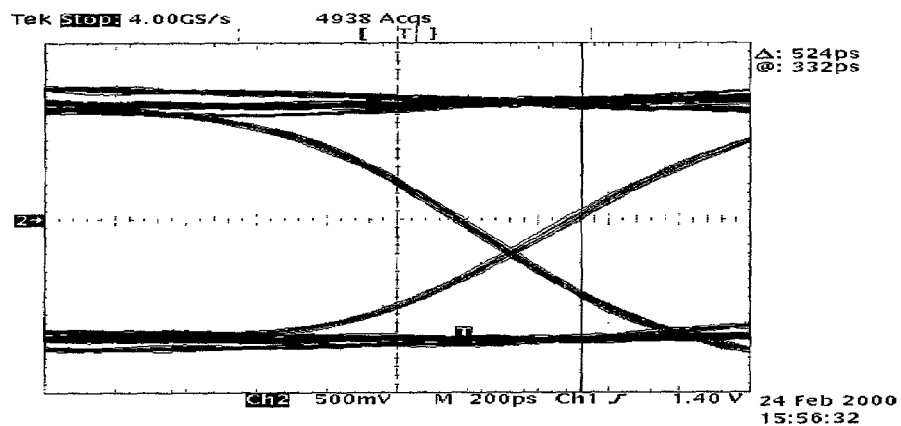
FIG. 4c is a graph illustrating a calibration procedure in relation to reference signal, wherein the calibration is performed at a falling edge of a clock signal.

If the timing error is measured at 1.4V level, the vertical position of the displayed signal shall be adjusted accordingly, so that the scope's central horizontal line would correspond to the 1.4V level. To measure time intervals, vertical cursors are enabled. The first cursor is set to the point where the center of the clock edge crosses the 1.4V level. Then, the second cursor is selected for measurements, while the position of the first one remains constant, as illustrated in FIG. 4b and FIG. 4c, where example diagrams are shown for SDR memory. It shall be mentioned that one and the same scope channel is used for both the reference and measured signals.

The measuring probe is disconnected from CK0 and connected to a signal that is chosen for timing error measurement. Using the second vertical cursor, two crosstalk measurements are made on each signal, to define the leftmost ($T_{left}$) and rightmost ($T_{right}$) timing error caused by crosstalk in transmission line. The leftmost timing error is measured at the leftmost point where signal traces cross the selected level on the scope's screen. The rightmost timing error is measured at the rightmost point where signal traces cross 1.4V level on the scope's screen.

The individual signal timing error is a signed value. For points on the left of the reference cursor (read: of the Clock edge) the timing error has a negative value. For points on the right of the first cursor the timing error has a positive value.

The procedure of crosstalk adjustment is iterative, and several iterations of full measurement may be preferably needed.

According to the embodiment of the invention where all fast output signals on the header are driven by multi-bit registers, and each register has its own delay vernier, such as described in PCT/RU99/00194 filed on Oct. 06, 1999, the signals are grouped so that the signals controlled by a selected vernier form one group, and signals controlled by different verniers, form different groups. The skew measurements are performed for groups of signals instead of performing measurements for each individual signal, thereby, the accuracy of measurements is increased and the time consuming measurement operations are reduced.

According to another embodiment, signals are grouped with respect to pin cards, so that the signals relating to a selected pin card form one group. Other criteria may be chosen to group the signals and obtain the advantages mentioned above.

At the first stage, the crosstalk timing error is adjusted in each group of signals. In a first iteration, in each group only a signal having leftmost timing error and a signal having rightmost timing error are considered. The average of these two values is calculated as $T_{update}$, as shown below.

The update $T_{update}$ to the propagation time for a given group is an additional delay value required to make the leftmost and the rightmost timing error symmetrical with respect to the reference clock. The update value is calculated as follows:

$$T_{update}=(T_{left}+T_{right})/2,$$

where $T_{left}$ is a minimum left crosstalk timing error value among all the individual signal timing errors measured for signals of the given group;

$T_{right}$ is a maximum right crosstalk timing error value among all the individual signal timing errors measured for all signals of the given group.

The $T_{update}$ is passed on to the SPD card and used further by vernier to shift this group of signals so that the group is centered at this average value at the next step of iterations. Preferably, when the leftmost and the rightmost deviation from the reference are counted in each group, further iterations are performed using only these measurements, and $T_{update}$ values for groups are calculated for all iterations except the final one. The final measurement must be complete to ensure the maximum timing error requirement is met on all signals.

To facilitate the calibration, a special update table may be used with pre-calculated results. The table contains minimum and maximum timing error values entered during current iteration to the table for each group. Update values are calculated for each group in the bottom row of the table and shall be entered in to the respective group tables. As the update values are used in further calculations, they can be adjusted directly in the respective cells of the group tables.

The method of the invention is further illustrated with reference to FIG. 3.

First, the memory storage that is mounted on the DIB, is initialized, i.e. some initial values shall be written in the memory, for example, zero update values. Second, the calibration procedure is running. The signal crosstalk artifact, such as delay, is measured as has been described in details above. Next step is measuring timing error with respect to the reference clock for fast DUT signals which are most likely to produce minimum and maximum timing error.

An example table providing typical DUT signals, which produce minimum and maximum skew in each Delay Vernier Group is shown below. This example is valid for SYNBASED baseboards and HDRDIMMG header boards.

| Delay Vernier Group | Minimum Skew | Maximum Skew |
| --- | --- | --- |
| 7 | DQ10, DQ36 | DQ8, DQ38 |
| 8 | DQ37 | DQ39 |
| 11 | DQ48 | DQ60 |
| 12 | DQ49 | DQ63 |
| 10 | BA1 | A4 |
| 9 | CB0 | CB6 |
| 13 | DQMB1 | DQMB7 |
| 14 | WE | CKE1 |
| 15 | S2 | S0 |

Once the reference line is selected and the position of the reference signal is fixed on the scope, a crosstalk timing error is calculated as defined by time difference between the position of the measured signal and the position of the reference signal, to obtain thus the relative values in respect to the selected reference. If the crosstalk timing error for these signals is within the desired range, e.g. within ±250 ps for the DDR memory, then, measurements are considered to be completed and the values are stored, otherwise, compensation coefficients are updated and the iterative procedure is continued as has been explained above.

The obtained relative data at the end of the measuring procedure is stored in the flash memory 4 for further usage by the controlling computer software as described above in detail.

Figure 3:
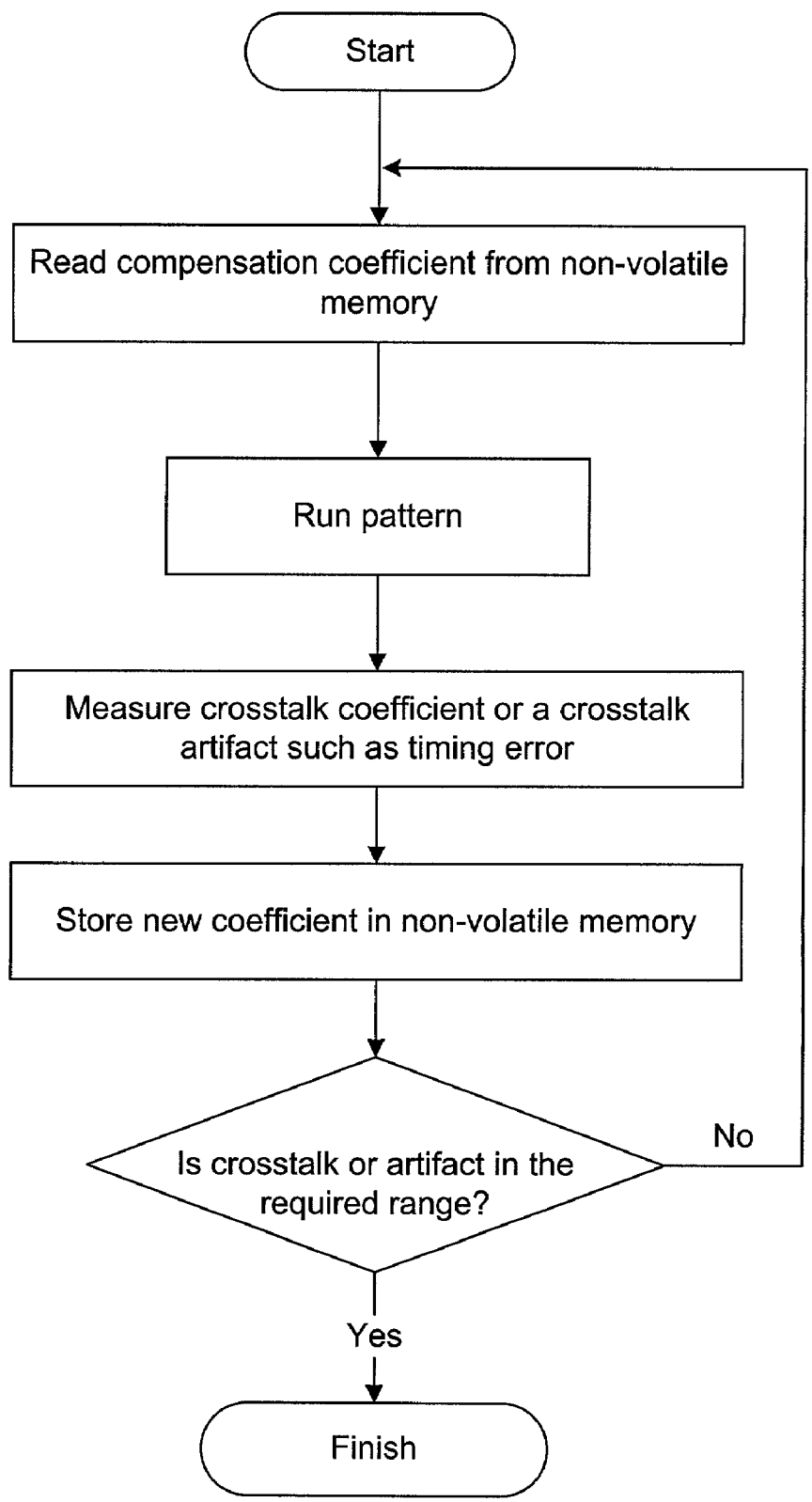
FIG. 3 is a flowchart of the method of compensating crosstalk in test results.

As shown in a flow chart in FIG. 3, the above procedure, as has been mentioned already, has an iterative character because the resulting crosstalk artifacts changes each time when a new compensation values applied and is performed sequentially until the crosstalk timing errors are minimized for a predetermined range when a single time control element, e.g. a vernier, is used to control several signals, or, eliminated, if each signal has a separate time control element.

The flow chart in FIG. 3 can be further modified by adding a step of reading interconnection data or in other way within the scope of the invention as shall be evident for a specialist in the art.

Another example embodiment of the procedure of the invention with respect to DDR memory is illustrated in the Attachment B.

It shall be appreciated also that other embodiments and modifications of the present invention are possible within the scope of the present invention. Thus, the invention may be applied to compensating timing errors in communication systems that can serve to increase the bandwidth of signal transmission. It can be applied to reduce timing dispersion of a signal in cases when signals are transmitted via an optical cable and in various other applications.

Appendix A

DDR DIB for Memory Tester

Purpose

This document describes specific requirements for any DDR DIB developed to provide an interface between bT72-332D memory tester developed by Acuid Corporation, and specific DDR DUT.

1 SCOPE

The scope of this document is the detailed set of requirements any DDR DIB should meet to be compatible with bT72-332D memory tester as well as with a specific DDR DUT.

2 DEFINITIONS

A, ADDR – DUT address signal.

BA – DUT bank select signal.

CAS - column address strobe signal in DUT.

CB – DUT check bit signal.

CK – DUT clock signal.

CKE - DUT clock enable signal.

CL - CAS latency, the number of clocks between the clock on which a Read command is issued and the clock on which read data appear on the DUT output.

DDR - double data rate, a technology used in synchronous dynamic memory modules which allows transferring data words at every edge of the clock signal.

DIB – DUT interface board, an electronic device (PCB-based normally) providing electronic and programming interface between a memory tester and a DUT.

DIB input connector – DIB connector interfacing header, which receives DUT driving signals, among others.

DIB output connector - DIB connector interfacing header, which sends signals from DUT to header, among others.

DIB unit – DIB complete with mechanical interfaces, chassis, accessories etc.

DIMM - dual-in-line memory module.

DLL - delay locked loop, a block used in DDR chips to compensate for temperature and voltage variations.

DM, DQMB – DUT low data mask signal.

DQ – input/output signal in DUT.

DQM - input/output mask signal in DUT. DQM is an input mask signal for write accesses and an output enable signal for read accesses.

DQS –low data strobe signal in DUT.

DRV – driver.

DUT - device under test.

ESD - electrostatic discharge.

Fault - an error occurring in the memory functional test. The following fault types are defined:

> AF - address decoder fault.
>
>> CF - coupling fault. A write operation, which generates a transition in one cell, changes the content of a second cell (see ref 1, p.50).
>>
>> CFid - idempotent coupling fault. A transition in one cell forces the content of a second cell to a certain value, 0 or 1 (see ref 1, p.51).
>>
>> CFin - inversion coupling fault. A transition in one cell inverts the content of a second cell (see ref 1, p.50).
>>
>> NPSF - neighborhood pattern sensitive fault. The content of a cell is influenced by the contents of surrounding cells in the memory (see ref 1, p.54).
>>
>> SAF - stuck-at fault. A constant value of 0 or 1 in a cell output. SAF0 / SAF1 mean stuck-at-zero / stuck-at-one faults respectively.
>>
>> TF - transition fault. It is a special case of the SAF. An up transition fault is defined as a fail to undergo a 0 to 1 transition in a write operation. A down transition fault is a failure to undergo a 1 to 0 transition on a write operation (see ref 1, p.47).
>>
>> Unlinked fault - A fault is unlinked if it does not influence the behaviour of other faults (see ref 1, p.70).

FETEN – external control signal for DUT which has FET switches in DQ path.

FIFO - first input, first output, the definition of the queue behaviour which can be implemented as either a hardware block or software function

FPG - functional pattern generator, a bT module generating a data inversion signal as a function of the row and column addresses.

Handler – any mechanical means used to place/remove DUT in testing position, among other operations with DUT. Could be automated, semiautomated or manual.

Header – replaceable part of a memory tester providing interface for testing DUTs of specific types (DDR header, SDRAM header etc).

Heater – any means used to provide thermal environment for DUT in accordance with test procedure.

NRS – non-regular signal.

PMU – parametric unit, part of tester responsible for parametric measurements.

RAS - row address strobe signal in DUT.

RCD, tRCD - RAS to CAS delay timing parameter. RCD is used to express the parameter value in clocks, tRCD is used to express the value in nanoseconds.

RCV – receiver.

RP, tRP - RAS to precharge time. It is the time after the Precharge command and before the bank(s) will be available for subsequent row accesses. RP is used to express the parameter value in clocks, tRP is used to express the value in nanoseconds.

S – DUT chip select signal.

SA –SPD address signal.

SCL –SPD clock signal.

SDA –SPD data signal.

SDR - single data rate, opposite to DDR defined above in this section.

SDRAM - synchronous dynamic random access memory.

SGRAM - synchronous graphic random access memory.

SMD – surface mount device.

SPD - serial presence detect, an additional memory on memory module (DIB) to store information about the module (DIB) parameters.

TPL - test program language, the language in which tests are written.

VDD –voltage to power DUT input buffers and core logic.

VDDID – signal identifying whether VDD is separated from VDDQ.

VDDQ – voltage to power DUT output buffers.

VREF –reference voltage for SSTL2 inputs.

VT – termination voltage.

WE – DUT write strobe signal.

WP –write protect signal.

3 SPECIFICATION

3.1 Electrical

Electrically DIB has a basic purpose of providing an interface between header and a specific DUT. However, there could be additional purposes, such as providing interface to handler, heater etc. DUT types may vary widely. These could be most types of memory devices (not limited to DDR and SDR) as well as non-memory ones.

Depending on the DUT type, DIB can have a single as well as multiple DUT connectors (single-site and multi-site DIB).

Normally, each DUT type requires a unique DIB. However, some DUT types can be compatible enough to use a common DIB.

On the other hand, different DIBs may be needed for the same DUT. Such DIBs can differ electrically as well as by PCB layout. This depends on DUT connector type used, DUT handler requirements, heater requirements etc.

For any specific DUT, electrically different DIBs can be developed using a certain freedom of connecting DIB inputs and outputs to DUT. This freedom, as well as some essential connections, is described by assignments and rules outlined below.

In order to facilitate these rules all high-speed DUT signals are grouped by their functionality into two sets of groups in accordance with Table 1. Each signal can belong to only one of DRV and only one of RCV functional groups.

DQ RCV functional group encompasses all signals having "CB", "DQ" or "DQS" in their names (see Table 1). This means functionally combined signals (such as DM/DQS, for example) apply as well. Signals which do not fit the criteria for DQ RCV functional group comprise Control RCV functional group.[1]

---

[1] Please note there could be a DUT which signals cannot satisfy this specification. Such is the case when DUT has at least one pair of signals, one of which is functionally combined with DQS and another has the same functionality minus DQS (for example, DM/DQS and DM). In this case it is recommended to contact Acuid Corporation Ltd. for a solution.

| High-speed DUT signal | DRV functional groups | | | | | | | RCV functional groups | |
|---|---|---|---|---|---|---|---|---|---|
| | DQ DRV | DQS DRV | Address DRV | DM DRV | Clock DRV | Select DRV | Control DRV | DQ RCV | Control RCV |
| A# | | | + | | | | | | + |
| BA# | | | + | | | | | | + |
| CAS_N | | | | | | | + | | + |
| CB# | + | | | | | | | + | |
| CK#(_N) | | | | | + | | | | + |
| CKE# | | | | | | | + | | + |
| DM# | | | | + | | | | | + |
| DQ# | + | | | | | | | + | |
| DQMB# | | | | + | | | | | + |
| DQS# | | + | | | | | | + | |
| FETEN | | | | | | | + | | + |
| RAS_N | | | | | | | + | | + |
| S#_N | | | | | | + | | | + |
| WE_N | | | | | | | + | | + |

Table 1: Groups of high-speed DUT signals

For a single-site DIB, when DUT is a DDR memory device, high-speed signals should be linked from DUT connector to header-interfacing connectors in a way shown in Figure 1. For SDR memory device the schematic should be as shown in Figure 2. Signal names correspond to pin assignments in Table 4 and Table 5.

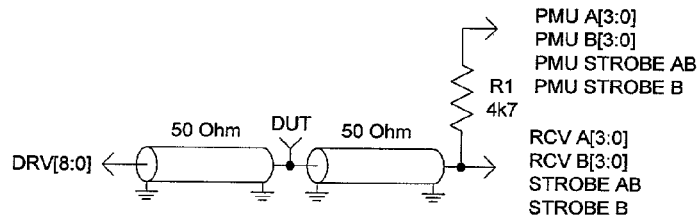

Figure 1: High speed signal schematic for DDR DUT

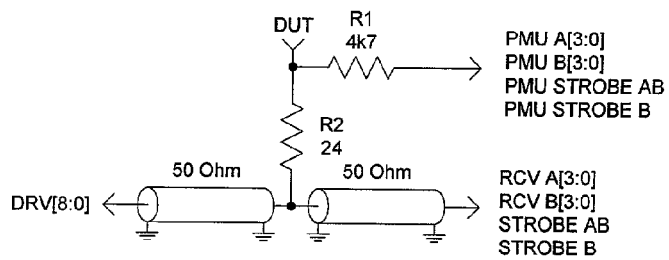

Figure 2: High speed signal schematic for SDR DUT

For a multi-site DIB, some of the high-speed signals may need to go to n DUTs (more than one). Whenever this is the case, signal schematic should be in accordance with Figure 3, both for DDR and SDR DUTs.

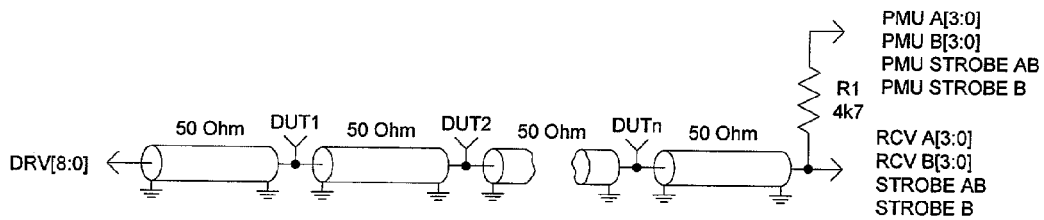

Figure 3: High speed signal schematic for signals common between multiple DDR DUTs

It is important that R1 and R2 resistors shown in Figure 1, Figure 2 and Figure 3 should have size no bigger than SMD0603 type.

Devices other than DDR or SDR memory could require different schematics. Some other issues could arise as well- it is recommended to contact Acuid Corporation Ltd. for a feasibility check in such case.

DIB should have 30 header-interfacing connectors 4x25=100 signal pins each. These connectors should be male, Z-Pack Stripline 100 type (AMP), or compatible. AMP product code is 646245-2. Connectors should be arranged as shown in Figure 4.
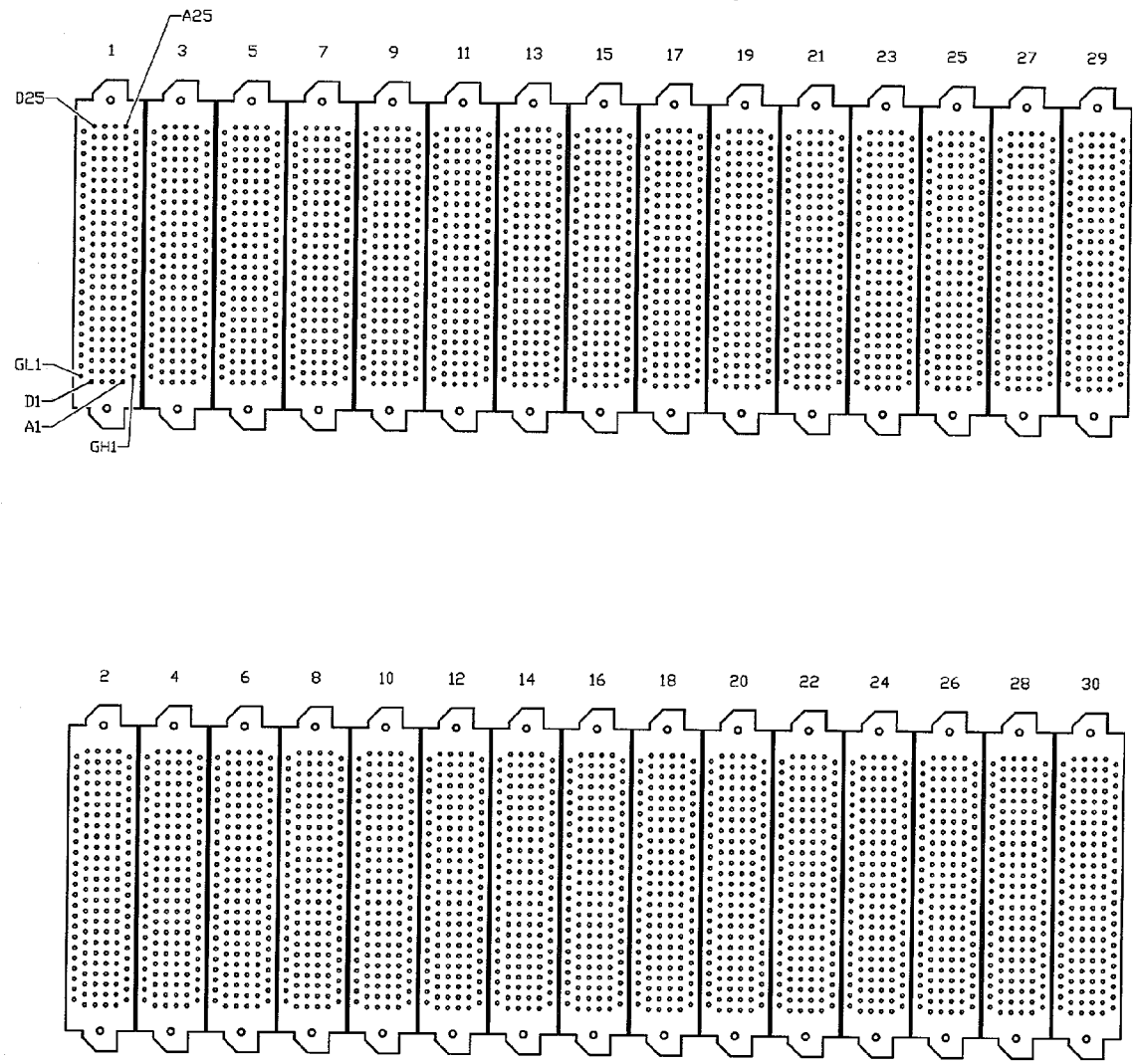
Figure 4: Header-interfacing connectors of DIB (viewed from mount side)

3.1.1 DIB header-interfacing connectors' assignments

Each header-interfacing connector can be assigned to only one of functional groups of signals assembled in accordance with Table 1.

| | Connector # | 1 | 3 | 5 | 7 | 9 | 11 | 13 | 15 | 17 | 19 | 21 | 13 | 25 | 27 | 29 |
|---|---|---|---|---|---|---|---|---|---|---|---|---|---|---|---|---|
| Functional Group Name | DQ DRV | + | | + | + | | + | + | | | + | | + | | + | + |
| | DQS DRV | + | | + | + | | + | + | + | | + | | + | | + | + |
| | Address DRV | | + | | | + | | | | | | | | | | |
| | DM DRV | | | | | | | | + | | | | | | | |
| | Clock DRV | | | | | | | | | + | | | | | | |
| | Select DRV | | | | | | | | | | | | | + | | |
| | Control DRV | | | | | | | | | | | + | | | | |

Table 2: DRV functional group- connector assignments

| | Connector # | 2 | 4 | 6 | 8 | 10 | 12 | 14 | 16 | 18 | 20 | 22 | 24 | 26 | 28 | 30 |
|---|---|---|---|---|---|---|---|---|---|---|---|---|---|---|---|---|
| Functional Group Name | DQ RCV | + | | + | + | | + | + | | | + | | + | | + | + |
| | Control RCV | | + | | | + | | | + | + | | + | | + | | |

Table 3: RCV functional group- connector assignments

Please note that odd-numbered connectors (see Table 2) are intended to connect DIB to header output signals, whereas even-numbered ones (see Table 3)- to header input signals. However, DRV and RCV functional groups incorporate parts of the same set of DUT signals (such as DQ, DQS, DM, ADDR, BA etc.), albeit differently grouped. DUT signals are meant in wider sense here: these are either original DUT signals, or signals separated from DUT with an impedance-matching resistor R2, depending on the DUT type.

3.1.2 DIB header-interfacing connectors: pin assignments

Table 4 and Table 5 specify pin assignments in general. This means that every signal name marked with * specifies functionality of the pin it is assigned to, rather than unique signal name. This is clearly seen in Figure 1 and Figure 2. Thus, only GND signal can be considered ultimately assigned within Table 4 and Table 5. All other signals should be assigned in accordance with rules described below. After all necessary assignments are made, pins which do not acquire any signal should be left non-connected.

GH and GL pins (could be seen in Figure 4) are not listed in Table 4 and Table 5 for clarity. These pins should be connected to GND net.

| Pin # | Assignment | Pin # | Assignment | Pin # | Assignment | Pin # | Assignment |
|---|---|---|---|---|---|---|---|
| A1 | GND | B1 | GND | C1 | GND | D1 | RELAY RESERVE* |
| A2 | GND | B2 | GND | C2 | GND | D2 | GND |
| A3 | GND | B3 | GND | C3 | GND | D3 | GND |
| A4 | GND | B4 | GND | C4 | GND | D4 | GND |
| A5 | GND | B5 | GND | C5 | GND | D5 | GND |
| A6 | GND | B6 | GND | C6 | GND | D6 | GND |
| A7 | GND | B7 | GND | C7 | GND | D7 | VT RCV A0* |
| A8 | GND | B8 | DRV0* | C8 | GND | D8 | GND |
| A9 | GND | B9 | GND | C9 | VT DRV012* | D9 | VT RCV A1* |
| A10 | GND | B10 | DRV1* | C10 | GND | D10 | GND |
| A11 | GND | B11 | GND | C11 | VT DRV012* | D11 | VT RCV A2* |
| A12 | GND | B12 | DRV2* | C12 | GND | D12 | GND |
| A13 | GND | B13 | GND | C13 | VT DRV012* | D13 | VT RCV A3* |
| A14 | GND | B14 | DRV3* | C14 | GND | D14 | GND |
| A15 | GND | B15 | GND | C15 | VT DRV345* | D15 | VT STROBE AB* |
| A16 | GND | B16 | DRV4* | C16 | GND | D16 | GND |
| A17 | GND | B17 | GND | C17 | VT DRV345* | D17 | VT RCV B0* |
| A18 | GND | B18 | DRV5* | C18 | GND | D18 | GND |
| A19 | GND | B19 | GND | C19 | VT DRV345* | D19 | VT RCV B1* |
| A20 | GND | B20 | DRV6* | C20 | GND | D20 | GND |
| A21 | GND | B21 | GND | C21 | VT DRV678* | D21 | VT RCV B2* |
| A22 | GND | B22 | DRV7* | C22 | GND | D22 | GND |
| A23 | GND | B23 | GND | C23 | VT DRV678* | D23 | VT RCV B3* |
| A24 | GND | B24 | DRV8* | C24 | GND | D24 | GND |
| A25 | GND | B25 | GND | C25 | VT DRV678* | D25 | VT STROBE B* |

Table 4: Pin assignments for odd-numbered connectors

| Pin # | Assignment | Pin # | Assignment | Pin # | Assignment | Pin # | Assignment |
|---|---|---|---|---|---|---|---|
| A1 | GND | B1 | GND | C1 | GND | D1 | GND |
| A2 | GND | B2 | RCV A0* | C2 | GND | D2 | PMU A0* |
| A3 | GND | B3 | GND | C3 | GND | D3 | GND |
| A4 | GND | B4 | RCV A1* | C4 | GND | D4 | PMU A1* |
| A5 | GND | B5 | GND | C5 | GND | D5 | GND |
| A6 | GND | B6 | RCV A2* | C6 | GND | D6 | PMU A2* |
| A7 | GND | B7 | GND | C7 | GND | D7 | GND |
| A8 | GND | B8 | RCV A3* | C8 | GND | D8 | PMU A3* |
| A9 | GND | B9 | GND | C9 | GND | D9 | GND |
| A10 | GND | B10 | STROBE AB* | C10 | GND | D10 | PMU STROBE AB* |
| A11 | GND | B11 | GND | C11 | GND | D11 | GND |
| A12 | GND | B12 | RCV B0* | C12 | GND | D12 | PMU B0* |
| A13 | GND | B13 | GND | C13 | GND | D13 | GND |
| A14 | GND | B14 | RCV B1* | C14 | GND | D14 | PMU B1* |
| A15 | GND | B15 | GND | C15 | GND | D15 | GND |
| A16 | GND | B16 | RCV B2* | C16 | GND | D16 | PMU B2* |
| A17 | GND | B17 | GND | C17 | GND | D17 | GND |
| A18 | GND | B18 | RCV B3* | C18 | GND | D18 | PMU B3* |
| A19 | GND | B19 | GND | C19 | GND | D19 | GND |
| A20 | GND | B20 | STROBE B* | C20 | GND | D20 | PMU STROBE B* |
| A21 | GND | B21 | GND | C21 | GND | D21 | GND |
| A22 | NRS0* | B22 | NRS1* | C22 | NRS2* | D22 | NRS3* |
| A23 | NRS4* | B23 | NRS5* | C23 | NRS6* | D23 | NRS7* |
| A24 | NRS8* | B24 | NRS9* | C24 | NRS10* | D24 | NRS11* |
| A25 | NRS12* | B25 | NRS13* | C25 | NRS14* | D25 | NRS15* |

Table 5: Pin assignments for even-numbered connectors

Pins DRV0 - DRV8 (see Table 4) can belong to any functional group of signals listed in Table 2.

Signals from DQ DRV, DQS DRV, DM DRV, Clock DRV, Select DRV and Control DRV functional groups can be assigned freely within respectively designated connectors. This means any signal from mentioned groups could be assigned to any specified pin within connector(s) designated for respective group.

For Address DRV functional group some limitations apply. Signals ADDR0 - ADDR4, ADDR6, ADDR10, BA0, BA1 should be assigned to connector #9, and signals ADDR5, ADDR7 - ADDR9, ADDR11 - ADDR14, BA2 - to connector #3. Within specified pins of the named connectors, the order of signals is free.

Unlike other functional groups, DQ RCV group is a structured one. Its DQ signals are grouped with DQS signals in accordance with DUT specification. This means DQ RCV group consists of DQS RCV subgroups having one DQS and some associated DQ signals each (4 or 8 DQ signals normally). DQS signals may be functionally combined ones, like DM/DQS.

Consequently, each connector assigned to the DQ RCV functional group should be dedicated to one or two above named DQS RCV subgroups, depending on their size. Subgroups can be assigned to specified connectors in a free order, i.e. any subgroup(s) to any connector assigned to DQ RCV group.

Within a connector, a certain order of assigning signals from a DQS RCV subgroup to specified pins should be followed.

If a subgroup has no more than 4 DQ signals, it can be assigned to the connector in three ways. One is to assign DQ signals to RCV A0 - RCV A3 pins, with DQS signal assigned to STROBE AB pin. Another one is to assign DQ signals to RCV B0 - RCV B3 pins, with DQS signal assigned to STROBE B pin. Third way is to assign DQ signals to RCV A0 - RCV A3 and RCV B0 - RCV B3 pins, with DQS signal assigned to STROBE AB (not STROBE B!) pin. The last way is the only possible one when a subgroup has 5-8 DQ signals. Within a DQS RCV subgroup DQ signals can be assigned to specified pins in a free order in any case.

Signals from Control RCV functional group can be assigned in free order to RCV A0 - RCV A3 and RCV B0 - RCV B3 pins of specified connectors (Table 3). The only exceptions are CK#(_N) signals (Table 1). These could be assigned to any pin of the same connectors, including STROBE AB and STROBE B pins, with the latter being preferred for CK#(_N) signals.

As a result of all said above and having in mind Figure 1 or Figure 2, Table 4 and Table 5, signals from any odd-numbered header-interfacing connector should go to DUT connector and then to an even-numbered connector. DUT may be connected directly, or by an impedance-matching resistor R2. Importantly, the named two connectors can belong to different columns as well as the same one.

All the above rules describe the freedom to connect DUT signals. This freedom is needed to make connections allowing simpler PCB, to easier meet PCB design and layout rules, as well as any other requirements.

VT DRV012, VT DRV345 and VT DRV678 pins should be connected to VT RCV A0 - VT RCV A3, VT RCV B0 – VT RCV B3, VT STROBE AB and VT STROBE B pins (Table 4) using the following instructions.

- Whenever a pin DRV# (one of DRV0- DRV8) of an odd-numbered connector is linked to a pin of an even-numbered connector (net A), a correlated link should be provided (net VT A). This link should connect two pins as minimum.

- One pin of net VT A belongs to VT DRV012, VT DRV345 and VT DRV678 set of the same connector as DRV# pin of net A, any of three digits in its name matching the one in DRV# name. Examples: VT DRV345 and DRV5, VT DRV678 and DRV7.

- Another pin of net VT A belongs to VT RCV A0 - VT RCV A3, VT RCV B0 – VT RCV B3, VT STROBE AB, VT STROBE B set of an odd-numbered connector that is located in the same column as an even-numbered one which has net A connected. This pin should have a name matching that of the even-numbered connector's pin, net A. Examples: VT RCV A2 and RCV A2, VT STROBE B and STROBE B (see Table 4 and Table 5).

Taking into account that each of VT DRV012, VT DRV345 and VT DRV678 pins is duplicated three times within an odd-numbered connector, duplicated pins could be connected together, or only one of duplicated pins used in relation to DRV0, DRV1, DRV2, or DRV3, DRV4, DRV5, or DRV6, DRV7, DRV8 pins. In these cases VT A net would connect together up to 6 pins.

PMU A0- PMU A3, PMU B0- PMU B3, PMU STROBE AB and PMU STROBE B pins should be connected in accordance with Figure 1 or Figure 2. The rules are as follows.

Any signal pin of the DUT connector should be linked to two pins of a single even-numbered connector (one by R1, another directly or by R2). These pins should have matching names. Examples: PMU A1 and RCV A1, PMU STROBE AB and STROBE AB.

RELAY RESERVE pins of odd-numbered connectors (see Table 4) could be used for driving relays or similar use on DIB or DIB-attached devices if needed.[2]

NRS0 – NRS15 pins could be assigned to various signals in accordance with Table 6.

---

[2] Present version of software does not support usage of these pins- please contact Acuid Corporation Ltd. if you have a need to use them.

| CONNECTOR # | | 2 | 4 | 6 | 8 | 10 | 12 | 14 | 16 | 18 |
|---|---|---|---|---|---|---|---|---|---|---|
| NRS# | NRS0 | "RUN" BUTTON (note 1) | VDD (note 2) | n.c. | n.c. | VDDQ (note 2) | n.c. | PMU SENSE RESERVE1 (note 3) | RESET N (note 2) | WP |
| | NRS1 | n.c. | VDD | n.c. | n.c. | VDDQ | n.c. | PMU SENSE RESERVE2 (note 3) | VDDID (note 2) | SA2 |
| | NRS2 | GND (note 2) | VDD | n.c. | n.c. | VDDQ | n.c. | PMU SENSE RESERVE3 (note 3) | VREF (note 2) | SA1 |
| | NRS3 | GND (note 2) | VDD | n.c. | n.c. | VDDQ | n.c. | PMU SENSE RESERVE4 (note 3) | n.c. | SA0 |
| | NRS4 | n.c. | VDD | n.c. | n.c. | VDDQ | n.c. | n.c. | RESET N (note 2) | WP SENSE |
| | NRS5 | n.c. | VDD | n.c. | n.c. | VDDQ | n.c. | n.c. | VDDID (note 2) | SA2 SENSE |
| | NRS6 | GND (note 2) | VDD | n.c. | n.c. | VDDQ | n.c. | n.c. | VREF (note 2) | SA1 SENSE |
| | NRS7 | GND (note 2) | VDD | n.c. | n.c. | VDDQ | n.c. | n.c. | n.c. | SA0 SENSE |
| | NRS8 | n.c. | VDD | n.c. | n.c. | VDDQ | n.c. | n.c. | n.c. | SDA |
| | NRS9 | n.c. | VDD | n.c. | n.c. | VDDQ | n.c. | n.c. | n.c. | SCL |
| | NRS10 | GND (note 2) | VDD | n.c. | n.c. | VDDQ | n.c. | n.c. | n.c. | VDDSPD (note 2) |
| | NRS11 | GND (note 2) | VDD | n.c. | n.c. | VDDQ | n.c. | n.c. | n.c. | n.c. |
| | NRS12 | n.c. | VDD | n.c. | n.c. | VDDQ | n.c. | n.c. | n.c. | SDA SENSE |
| | NRS13 | n.c. | VDD | n.c. | n.c. | VDDQ | n.c. | n.c. | n.c. | SCL SENSE |
| | NRS14 | GND (note 2) | VDD | n.c. | n.c. | VDDQ | n.c. | n.c. | n.c. | VDDSPD (note 2) |
| | NRS15 | GND (note 2) | VDD | n.c. | n.c. | VDDQ | n.c. | n.c. | n.c. | Do not connect |

Notes:

1. Connecting this pin to GND net with a button switch (normally open) or other means generates "RUN" command 2. Special routing rules apply to this pin 3. Present version of software does not support usage of this pin- please contact Acuid Corporation Ltd. if you have a need to use it.

Table 6 : NRS signal assignments

| CONNECTOR # | 20 | 22 | 24 | 26 | 28 | 30 |
|---|---|---|---|---|---|---|
| NRS# NRS0 | RETURN +5(+15) | DIB FEEDBACK1 (note 3) | Do not connect | n.c. | +5V (note 5) | +15V (note 6) |
| NRS1 | RETURN +5(+15) | DIB FEEDBACK2 (note 3) | Do not connect | n.c. | +5V (note 5) | +15V (note 6) |
| NRS2 | RETURN +5(+15) | DIB FEEDBACK3 (note 3) | Do not connect | n.c. | +5V (note 5) | +15V (note 6) |
| NRS3 | RETURN +5(+15) | DIB FEEDBACK4 (note 3) | Do not connect | n.c. | +5V (note 5) | +15V (note 6) |
| NRS4 | RETURN +5(+15) | DIB RELAY1 N (note 3) | Do not connect | n.c. | +5V (note 5) | +15V (note 6) |
| NRS5 | RETURN +5(+15) | DIB RELAY2 N (note 3) | Do not connect | n.c. | +5V (note 5) | +15V (note 6) |
| NRS6 | RETURN +5(+15) | DIB RELAY3 N (note 3) | Do not connect | n.c. | +5V (note 5) | +15V (note 6) |
| NRS7 | RETURN +5(+15) | n.c. | Do not connect | n.c. | +5V (note 5) | +15V (note 6) |
| NRS8 | RETURN +5(+15) | n.c. | Do not connect | n.c. | +5V (note 5) | +15V (note 6) |
| NRS9 | RETURN +5(+15) | n.c. | Do not connect | n.c. | +5V (note 5) | +15V (note 6) |
| NRS10 | RETURN +5(+15) | n.c. | Do not connect | n.c. | +5V (note 5) | +15V (note 6) |
| NRS11 | RETURN +5(+15) | n.c. | Do not connect | n.c. | +5V (note 5) | +15V (note 6) |
| NRS12 | RETURN +5(+15) | n.c. | DIB SDA | "BUSY" LED (note 4) | +5V (note 5) | +15V (note 6) |
| NRS13 | RETURN +5(+15) | n.c. | DIB SCL | "FAIL" LED (note 4) | +5V (note 5) | +15V (note 6) |
| NRS14 | RETURN +5(+15) | n.c. | DIB WP | "PASS" LED (note 4) | +5V (note 5) | +15V (note 6) |
| NRS15 | RETURN +5(+15) | n.c. | VDD DIB SPD | "POWER" LED (note 4) | +5V (note 5) | +15V (note 6) |

Notes:

3. Present version of software does not support usage of this pin- please contact Acuid Corporation Ltd. if you have a need to use it.

4. Using this pin requires some hardware changes in DDR header- please contact Acuid Corporation Ltd. if you have a need to use it.

5. Maximum power consumption for +5V is 1A

6. Maximum power consumption for +15V is 1A

Table 5 (continued): NRS signal assignments

Figure 5:
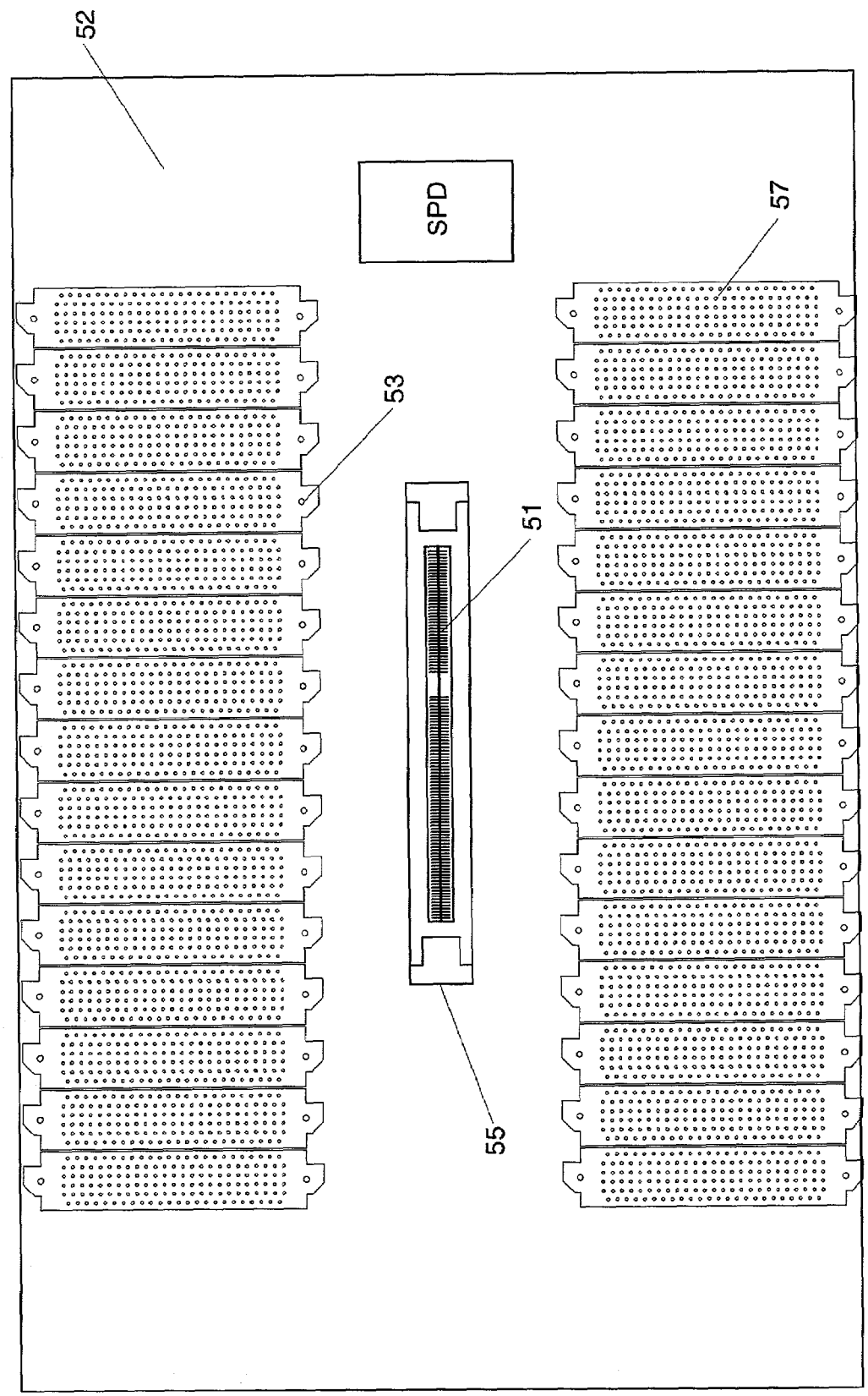
FIG. 5 is a plan view of an example embodiment of the device interface board.

NRS0- NRS9, NRS12 and NRS13 pins of connector #18 (see Table 6) should be connected in accordance with Figure 5.

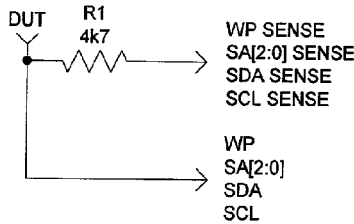

Figure 5: DIB- slow speed signal schematic

NRS12- NRS15 pins of connector #24 (see Table 6) should be connected to SPD chip on DIB in accordance with Figure 6.

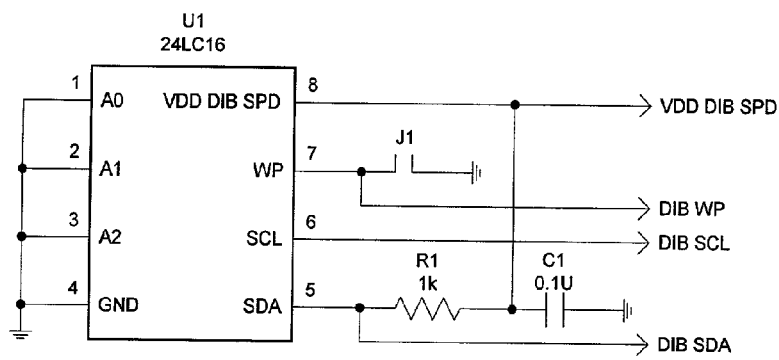

Figure 6: DIB- SPD schematic

3.2 PCB design

PCB design and layout of DIB should follow some rules described below.

Any signal from any functional group listed in Table 2 and Table 3 should be routed with traces with matched impedance of 50±5 Ohm (see Figure 1 and Figure 2). Impedance should be measured at 1GHz or by TDR method with 400ps signal edge.

Cross talk between any pair of traces, with at least one having matched impedance, should not exceed −60dB.

An example of a matched impedance layer configuration providing for the above requirements is shown in Figure 7, with an example of DIB PCB build shown in Table 7.

However, such impedance precision is not enough to provide signal skew within spec. Certain groups of traces should have smaller impedance difference. Since making tight manufacturing tolerances is normally not possible to desired levels, it is necessary to use a rule for assigning signals to PCB layers. This rule applies to any functional group listed in Table 2 and Table 3 except Control RCV group.

The rule is: signals assigned to a single header-interfacing connector and belonging to any one of functional groups mentioned above should be routed within a single layer along a stretch from that connector to DUT connector. Taking into account that each signal has two such stretches (see Figure 1 and Figure 2), it can be routed within two different layers (one for each stretch), as well as within a single layer.

In case DUT connector is separated from matched impedance routes with impedance-matching resistors R2 (Figure 2), routes between these resistors and DUT connector should be short as possible (no longer than 2.54mm preferably). Non-impedance stubs of routes with matched impedance should be no longer than 1.53mm.

Resistor R1 featured in Figure 5 should have a link to DUT connector as short as possible.

Following rules apply to route lengths. The latter should be measured as propagation delays from pin of DUT connector to pin of header-interfacing connector.

Propagation delays in routes belonging to signals of any DRV functional group (listed in Table 2) should not differ more than 100ps between different header-interfacing connectors. The same applies separately to routes belonging to signals of RCV functional groups (listed in Table 3). This means that difference in propagation delays between DRV and RCV functional groups is not restricted.

Within each header-interfacing connector, propagation delays of routes should not differ more than 1ps. This applies to routes belonging to any functional group listed in Table 2 and Table 3, except Control RCV group.

Some rules apply to routing GND, VDD, VDDQ, RESET N, VDDID, VREF and VDDSPD nets.

GND should be routed with plane(s), except for some pins of header-interfacing connector #2 (see Table 6, note 1). Each of these pins should be connected to GND plane only with a route going to a single (any) pin of the DUT connector. The latter should be the same pin for every one of eight mentioned pins of connector #2 (NRS2, NRS3, NRS6, NRS7, NRS10, NRS11, NRS14 and NRS15).

VDD and VDDQ: each should be routed with a plane preferably. Otherwise these could be routed with split planes within the same layer. Pins NRS0 of connectors #4 and #10 are the exceptions here (see Table 6, note 1). Each of these pins should be connected to respective plane only with a route going to a single pin of the DUT connector. The latter pin should be the one most distant from NRS1- NRS15 pins of connector #4 or #10, respectively.

RESET N, VDDID, VREF and VDDSPD should be routed with a trace that goes from a header-interfacing connector to DUT connector and back to another pin of the same header-interfacing connector. Example: NRS2 - DUT connector - NRS6 (for VREF net, connector #16).

Mechanically, DIB PCB should meet all the requirements imposed by connectors used, mechanical design of the DIB unit, DUT heater, DUT handler etc. In case standard DIB unit design developed by Acuid Corporation Ltd is supposed to be used with a newly designed DIB PCB, the latter should be in accordance with Figure 8.

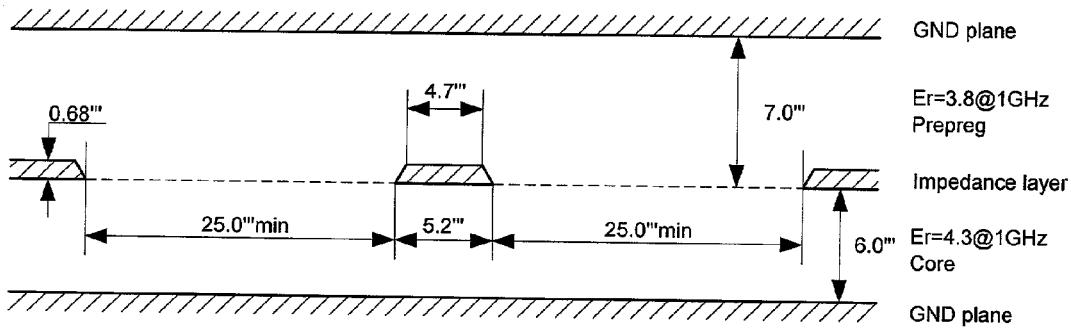

Figure 7: 50 Ohm matched impedance layer configuration (by Acuid Corporation Ltd.)

| No | Layer type | Material | Dielectric constant | Thickness |
|---|---|---|---|---|
| 1 | L1, Top layer | Copper | | 0.5oz/0.68'''/17um |
| 2 | Prepreg | FR-4 | 3.8@1GHz | 7'''/0.178mm |
| 3 | L2, Impedance traces | Copper | | 0.5oz/0.68'''/17um |
| 4 | Core | FR-4 | 4.3@1GHz | 6'''/0.152mm |
| 5 | L3, Split/Mix. Plane | Copper | | 0.5oz/0.68'''/17um |
| 6 | Prepreg | FR-4 | 3.8@1GHz | 7'''/0.178mm |
| 7 | L4, Impedance traces | Copper | | 0.5oz/0.68'''/17um |
| 8 | Core | FR-4 | 4.3@1GHz | 6'''/0.152mm |
| 9 | L5, Split/Mix. Plane | Copper | | 0.5oz/0.68'''/17um |
| 10 | Prepreg | FR-4 | 3.8@1GHz | 7'''/0.178mm |
| 11 | L6, Impedance traces | Copper | | 0.5oz/0.68'''/17um |
| 12 | Core | FR-4 | 4.3@1GHz | 6'''/0.152mm |
| 13 | L7, Split/Mix. Plane | Copper | | 0.5oz/0.68'''/17um |
| 14 | Prepreg | FR-4 | 3.8@1GHz | 7'''/0.178mm |
| 15 | L8, Impedance traces | Copper | | 0.5oz/0.68'''/17um |
| 16 | Core | FR-4 | 4.3@1GHz | 6'''/0.152mm |
| 17 | L9, Split/Mix. Plane | Copper | | 0.5oz/0.68'''/17um |
| 18 | Prepreg | FR-4 | 3.8@1GHz | 7'''/0.178mm |
| 19 | L10, Impedance traces | Copper | | 0.5oz/0.68'''/17um |
| 20 | Core | FR-4 | 4.3@1GHz | 6'''/0.152mm |
| 21 | L11, Split/Mix. Plane | Copper | | 0.5oz/0.68'''/17um |
| 22 | Prepreg | FR-4 | 3.8@1GHz | 7'''/0.178mm |
| 23 | L12, Impedance traces | Copper | | 0.5oz/0.68'''/17um |
| 24 | Core | FR-4 | 4.3@1GHz | 6'''/0.152mm |
| 25 | L13, Split/Mix. Plane | Copper | | 0.5oz/0.68'''/17um |
| 26 | Prepreg | FR-4 | 3.8@1GHz | 7'''/0.178mm |
| 27 | L14, Bottom layer | Copper | | 0.5oz/0.68'''/17um |

Table 7: DIB PCB build developed by Acuid Corporation Ltd.

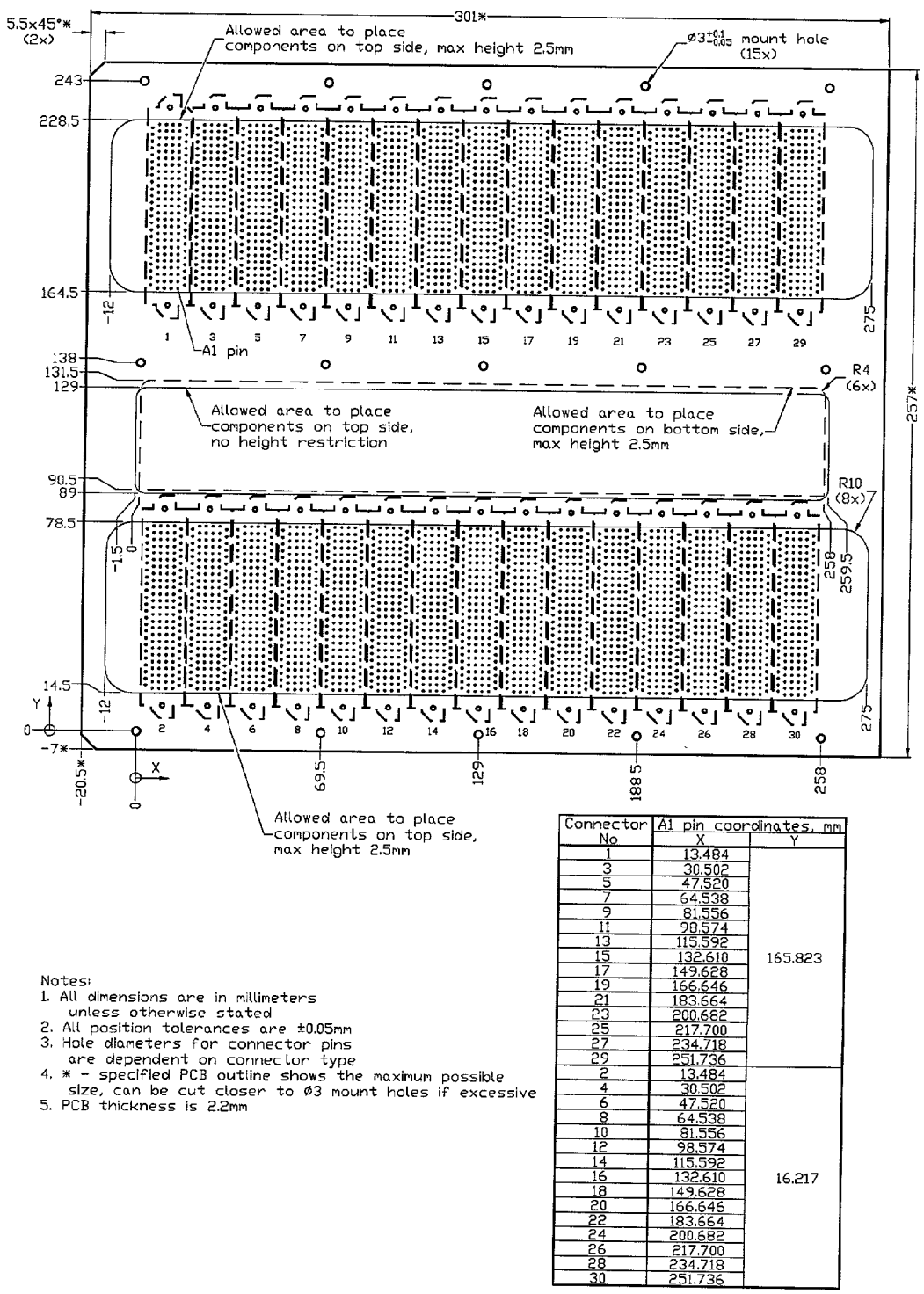
Figure 8: DIB PCB features required by standard DIB unit design (by Acuid Corp. Ltd.)

Appendix B

Fine Skew Adjustment Procedure for DDR Header

Equipment Required

1. A calibrated 1GHz bandwidth, 4GS/s sample rate digital oscilloscope, or better, with minimum of 2 active probes (including differential one) with no more than 1pF input capacitance.
2. Base board RevE (SYNBASEE) or RevD (SYNBASED) assembled in a Base case, set of 15 pincards DDRPEC1C or DDRPEC1D and Header board DDRHDRB,DDRHDRC or DDRHDRD assembled in a Header case.
3. DIB revision DDRDC1C.
4. DDRSCB card for skew measurement.
5. An appropriate hardware/software configured PC running Acuid Tools Software.

1 Procedure Algorithm

1. Run Calibration from Acuid Tools. It must finish successfully. If it doesn't, return Header to debugging.
2. On all fast DUT signals measure skew in respect to the reference clock signal (see section 3 for details) and save results.
3. If skew of signals is within the range of ±200ps then go to step 7, otherwise continue.
4. Update the correction factors stored in the Header's flash-memory. (See sections 4 for details on updating flash-memory).
5. Go to step 2.
6. Save Header SPD to a file (See sections 4 for details).

2 Individual Signal Skew Measurement

The skew of a signal is measured with respect to the reference differential clock signal CK0. Clock signal CK1 is used to trigger the scope. Note that for skew measurement all signals are observed on test points of DDRSCB card. Both rising and falling edges of the signal being measured are to be considered. To observe them simultaneously you need to configure the scope to accumulate waveforms with reasonable persistence and trigger from a clock signal.

Skew measurements are performed whilst the system is running the "Skew" test started under the Acuid Tools software. This test is running continuously and generates transitions on all signals to be checked.

To achieve the best possible precision and resolution the scope should have only one channel activated when taking measure. This will ensure that the total sample rate is not divided between several channels and all assigned to the channel of interest. The other channel is only used to trigger the scope.

There are four types of DDR DUT fast signals:

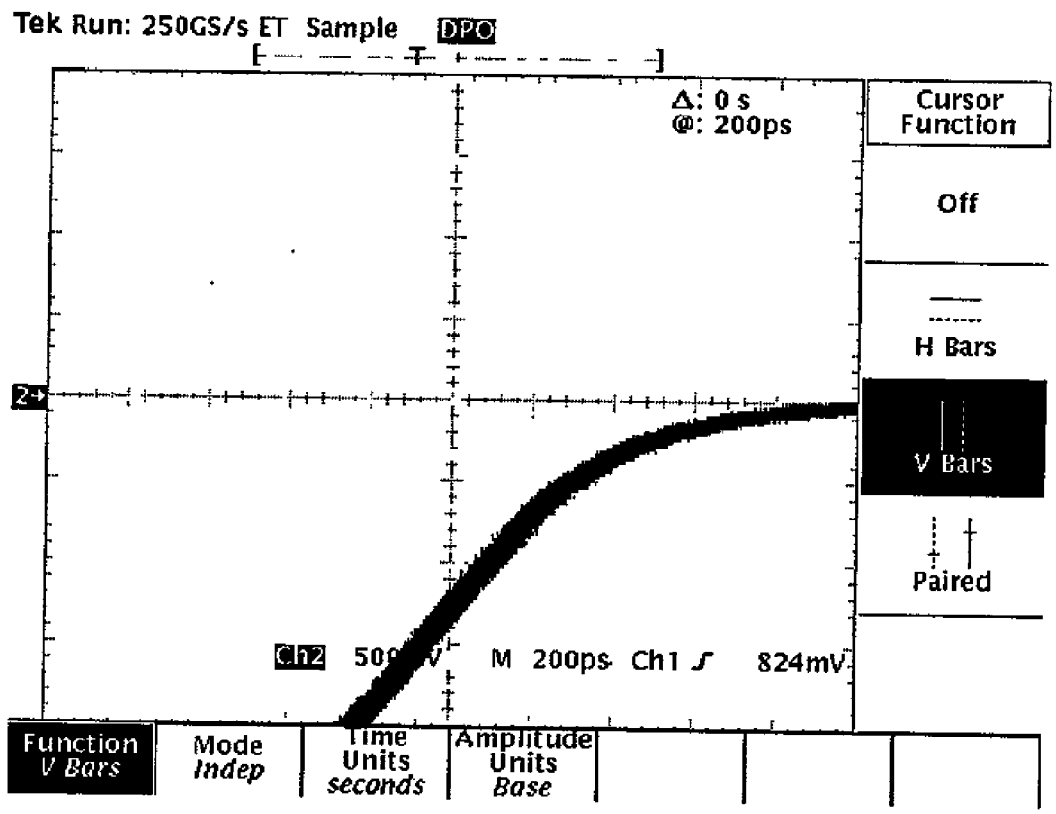
Fig.1. Reference clock signal CK0.

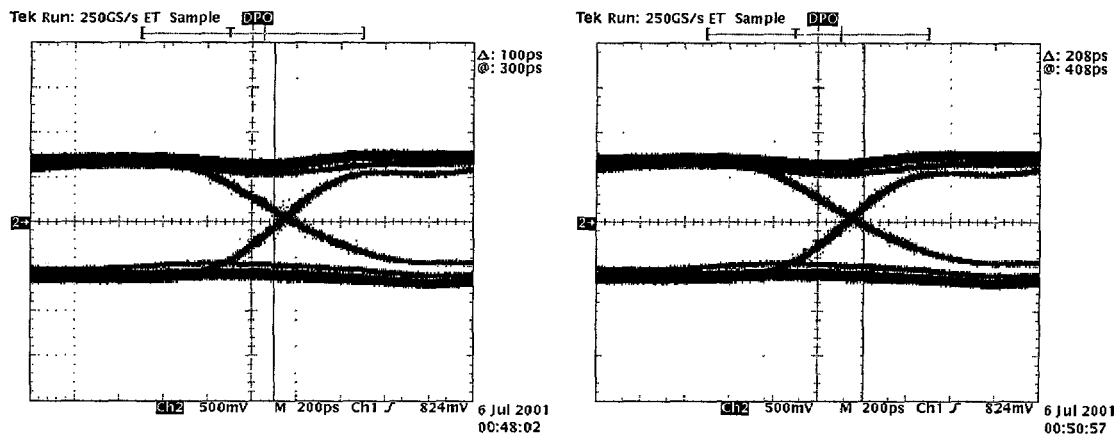
Fig.2. Signal skew measurement.

$$\text{UPDATE} = (T_{MIN} + T_{MAX})/2 \quad (\text{ps})$$

where $T_{MIN}$ is a minimum left skew value among of all the individual signal skews measured on signals of the given group;

$T_{MAX}$ is a maximum right skew value among of all the individual signal skews measured on signals of the given group.

UPDATE values for groups have to be calculated for all iterations except the final one. To facilitate the work there is a special table in theDDR_Skew.xls file. The table contains skew records and UPDATE values calculated for each group. UPDATE values need to be added to the correspondent correction values in the on-DIB flash memory (see section 4 for details).

4 SPD reader/writer

The SPD Writer software tool is used to read, write and update contents of the on-DIB flash memory, otherwise known as Series Presence Detect memory (SPD). Do not confuse this memory with the Series Presence Detect chips on DIMMs. We hereafter describe using of the SPD Reader/Writer tool to update signal delays.

It is essential to stop any tests started from Acuid Tools before invoking the SPD Reader/Writer software. As compensation factors are stored in the DIB SPD here we'll give more consideration to the "DIB" dialog's items.

There are four items in the right part of the "DIB" dialog window:

"Load From File" – allows to load SPD contents from a file.

"Save To File" – allows writing SPD contents into a file.

"Load From Tester" – allows reading SPD of the header submitted to adjustment.

"Save To Tester" – allows writing correction factors into SPD memory. This item is used to complete an iteration of adjustment.

Buttons placed in the left bottom part of the "DIB SPD" dialog window are used to operate with tags in the "Tag" field.

To write correction coefficients into the DIB SPD the following procedure algorithm should be implemented.

1. Select "Load From Tester" item in the "DIB" dialog window.

Result: tags appear in the "Tags" field.

2. Click "Add" button, then select "Signal Receiver Correction" tag in the "Named tag" field, click "OK".

Result: the "Signal Receiver Correction" tag is added to the "Tags" field.

If "Signal Receiver Correction" tag is already added to the "Tags" field then it needs to be selected only.

3. Click "Edit" button.

Result: the "Signal Receiver Correction" window will spawn. Select "bT72_DDR.pin" line in the "Header Pin Set" field. Compensation factors will be shown in the "Compensation" field.

4. Update compensation factors.

To update compensation values, select all signals belonging to the same group, click "Add" button, enter calculated UPDATE value to add it to current compensation value. Repeat this for all other groups.

Note that in the signal group "Slot 2" a compensation coefficient should be entered for A14 as well as for all other signals though A14 couldn't be observed with oscilloscope.

"Signal Receiver Correction" dialog window with updated compensation coefficients is shown in figure below.

5. Click "OK" button.

6. Select "Save To Tester" item in the "DIB SPD" dialog window.

7. Close SPD Reader/Writer.

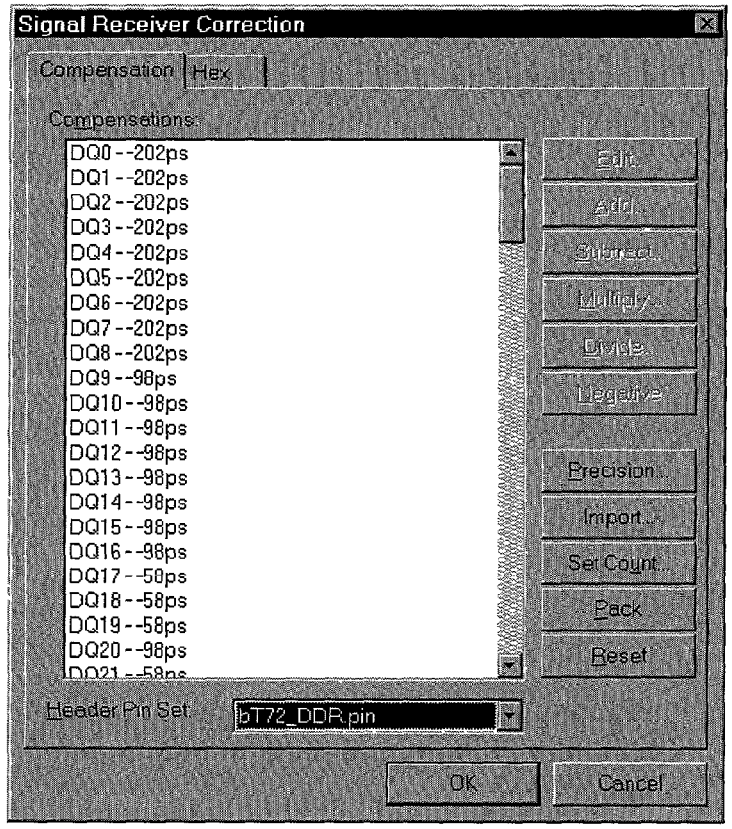

Fig.3. "Signal Receiver Correction" dialog window.

Typical Signal Grouping

The table below provides signal grouping on bT72_DDR Header and an example of a table for skew records.

Slot 1

| Signal | DQ4 | DQ0 | DQ5 | DQ1 | DQ6 | DQ2 | DQ7 | DQ3 | DQ8 |
|---|---|---|---|---|---|---|---|---|---|
| R / left | | | | | | | | | |
| R / right | | | | | | | | | |
| F / left | | | | | | | | | |
| F / right | | | | | | | | | |

Slot 2

| Signal | A14 | A13 | BA2 | A12 | A11 | A9 | A7 | A8 | A5 |
|---|---|---|---|---|---|---|---|---|---|
| Rising / left | | | | | | | | | |
| Rising / right | | | | | | | | | |

Slot 3

| Signal | DQ9 | DQ12 | DQ13 | DQ14 | DQ15 | DQ10 | DQ11 | DQ20 | DQ16 |
|---|---|---|---|---|---|---|---|---|---|
| R / left | | | | | | | | | |
| R / right | | | | | | | | | |
| F / left | | | | | | | | | |
| F / right | | | | | | | | | |

Slot 4

| Signal | DQ17 | DQ21 | DQ18 | DQ22 | DQ19 | DQ23 | DQ24 | DQ28 | DQ25 |
|---|---|---|---|---|---|---|---|---|---|
| R / left | | | | | | | | | |
| R / right | | | | | | | | | |
| F / left | | | | | | | | | |
| F / right | | | | | | | | | |

Slot 5

| Signal | A6 | A4 | A3 | A2 | A1 | A0 | A10 | BA1 | BA0 |
|---|---|---|---|---|---|---|---|---|---|
| Rising / left | | | | | | | | | |
| Rising / right | | | | | | | | | |

Slot 6

| Signal | DQ29 | DQ30 | DQ26 | DQ27 | DQ31 | CB4 | CB5 | CB0 | CB1 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

Slot 7

| Signal | DQS0 | DQS1 | DQS2 | DQS3 | DQS8 | DQS4 | DQS5 | DQS6 | DQS7 |
|---|---|---|---|---|---|---|---|---|---|
| Rising / average | | | | | | | | | |
| Falling / average | | | | | | | | | |

Slot 8

| Signal | DM0 | DM1 | DM2 | DM3 | DM8 | DM4 | DM5 | DM6 | DM7 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

Slot 9

| Signal | CK1 | CK0 | CK2 |
|---|---|---|---|
| Rising / average | | | |
| Falling / average | | | |

Slot 10

| Signal | CB2 | CB6 | CB3 | CB7 | DQ32 | DQ36 | DQ33 | DQ37 | DQ34 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

Slot 11

| Signal | | | | CKE1 | CKE0 | RAS | WE | CAS | FETEN |
|---|---|---|---|---|---|---|---|---|---|
| Rising / left | | | | | | | | | |
| Rising / right | | | | | | | | | |

Slot 12

| Signal | DQ38 | DQ39 | DQ35 | DQ40 | DQ44 | DQ45 | DQ41 | DQ42 | DQ43 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

Slot 13

| Signal | S0 | S1 | S2 | S3 |
|---|---|---|---|---|
| Rising / left | | | | |
| Rising / right | | | | |

Slot 14

| Signal | DQ46 | DQ47 | DQ48 | DQ49 | DQ52 | DQ53 | DQ54 | DQ55 | DQ50 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

Slot 15

| Signal | DQ51 | DQ60 | DQ61 | DQ56 | DQ57 | DQ62 | DQ63 | DQ58 | DQ59 |
|---|---|---|---|---|---|---|---|---|---|
| Rising / left | | | | | | | | | |
| Rising / right | | | | | | | | | |
| Falling / left | | | | | | | | | |
| Falling / right | | | | | | | | | |

We claim:

1. An interface device for connecting a transmitting device having a first plurality of terminals and deriving a plurality of signals of a predetermined data pattern, the signals being arranged in groups, and a receiving device having a second plurality of terminals for receiving said signals;

the interface device comprising:

input connectors connectable to said transmitter's terminals and output connectors connectable to said receiver's terminals;

a plurality of transmission lines within said interface device, for interconnecting said input and output connectors, the transmission lines being arranged in groups corresponding to said groups of signals; and a nonvolatile memory for storing data on timing errors in each said group of transmission lines, measured with respect to a reference signal where a tester is running a specific data pattern, to provide compensation of the timing errors caused by crosstalk effects for this particular combination of signals;

so that the transmitting device is capable of compensating for timing errors in said groups of transmission lines using data read from said nonvolatile memory.

2. The interface device of claim 1, wherein said transmission lines in one group are of equal electrical length.

3. The interface device of claim 1, wherein, in case the transmitting device comprises a plurality of registers for driving signals, each register having a respective delay vernier for controlling a separate group of signals, the signals controlled by a separate vernier are fed to a separate group of input connectors.

4. The interface device of claim 1, wherein the data stored in said non-volatile memory comprises data on crosstalk timing errors measured for said groups of signals.

5. The interface device of claim 1, wherein the data stored in said memory comprises data on crosstalk timing errors measured for each signal of the group.

6. The interface device of claim 1, wherein the data stored in said non-volatile memory comprises data on interconnections between said first and second plurality of terminals and data on crosstalk timing errors in said transmission lines relating to a specific data pattern, for each of said stored interconnection.

7. The interface device of claim 1, wherein the data stored in said non-volatile memory comprises data measured in a series of iterations.

8. The interface device of claim 1, wherein the data are stored in the form of a table containing update values entered during each iteration for centering said groups of signals with respect to the reference signal.

9. A semiconductor device test system having a plurality of terminals and deriving a plurality of signals of a predetermined data pattern, the signals being arranged in groups, to be applied to a semiconductor device under test, the test system comprising an interface device for connecting the test system and the semiconductor device;

the interface device comprising:

input connectors for connecting to said terminals of the test system and output connectors for connecting to said semiconductor device terminals;

a plurality of transmission lines within said interface device, the transmission lines being arranged in groups corresponding to said groups of signals; and a nonvolatile memory for storing data on interconnections between said input and output connectors and data on timing errors in each said group of transmission lines measured with respect to a reference signal where a tester is running a specific data pattern, to compensate the timing errors caused by crosstalk effects for this particular combination of signals for each of said stored interconnection;

wherein the test system is capable of compensating for timing errors caused by crosstalk effects in said groups of transmission lines using data read from said nonvolatile memory.

10. The system of claim 9, wherein said transmission lines of one group are of equal electrical length.

11. The system of claim 9, wherein said transmission lines of one group are located within one layer of the interface device.

12. The system of claim 9, wherein the transmitting device comprises a plurality of registers for driving signals, each register having a respective delay vernier for controlling a separate group of signals, and the signals controlled by separate verniers are fed to a separate group of transmission lines.

13. The system of claim 9, wherein the transmitting device comprises a plurality of pin cards comprising registers for driving signals, each register having a respective delay vernier, and the signals derived from the separate pin card are fed to a separate group of transmission lines.

14. The system of claim 9, wherein data from crosstalk timing errors are stored with circuit connectivity data in the said nonvolatile memory in the form of a table containing update values entered during current iteration.

15. The system of claim 13, wherein each pin card further comprises a non-volatile memory for storing data on crosstalk timing errors in the said pin card, the test system being capable of compensating for timing errors caused by crosstalk using data read from said nonvolatile memory.

16. The system of claim 9, wherein the transmitter further comprises a non-volatile memory for storing data on crosstalk timing errors in a tester's header, the test system being capable of compensating for timing errors caused by crosstalk using data read from said nonvolatile memory.

17. A method of compensating timing errors in transmission lines comprising the steps of:

transmitting via transmission lines a plurality of signals of a predetermined data pattern to be applied to a semiconductor device, the signals being driven in groups;

comparing the output response of a group of signals with a reference signal level;

measuring timing errors whilst the system is running a special crosstalk test to obtain crosstalk timing errors;

adjusting correction coefficients written to a non-volatile memory during production based on the obtained crosstalk timing errors;

storing in the non-volatile memory data on crosstalk timing errors in said transmission lines caused by crosstalk effects for this particular combination of signals for specific data patterns, for each separate group of signals; and compensating for timing errors in said transmission lines for each said group of signals using said data read from the nonvolatile memory.

18. The method of claim 17, wherein the procedure of compensation timing errors is iterative.

19. The method of claim 18, wherein, during the first iteration, the timing errors are measured for groups of signals, each group of signals being controlled by a separate delay vernier of a transmitter's register.

20. The method of claim 18, wherein, during the first iteration, the timing errors are measured for groups of signals, each group of signals relating to a separate pin card.

21. The method of claim 17, wherein, for each group of signals, the leftmost and the rightmost skew value with respect to a reference signal are measured and the whole group of signals is shifted for the average of these two values to adjust its position with respect to the reference signal.

22. The method of claim 17, wherein the timing errors are measured for each bit of a signal.

23. The method of claim 17, wherein, before skew measurements, a clock signal delay is measured to provide high accuracy in subsequent measurements.

24. A method of testing a semiconductor device comprising transmitting via transmission lines a plurality of signals of a predetermined data pattern to be applied to said semiconductor device, the signals being arranged in groups;

comparing the output response of a group of signals with a reference voltage;

storing in a non-volatile memory data from crosstalk artifacts in said transmission lines relating to specific data patterns, for each separate group of signals, wherein the data are obtained by measuring timing errors whilst the system is running a special crosstalk test and adjusting correction coefficients written to a non-volatile memory during production based on the obtained crosstalk timing errors; and compensating for artifacts caused by crosstalk in said transmission lines for each said group of signals using said data read from said nonvolatile memory.

* * * * *